United States Patent
Kim et al.

(10) Patent No.: US 7,580,319 B2
(45) Date of Patent: Aug. 25, 2009

(54) INPUT LATENCY CONTROL CIRCUIT, A SEMICONDUCTOR MEMORY DEVICE INCLUDING AN INPUT LATENCY CONTROL CIRCUIT AND METHOD THEREOF

(75) Inventors: Kyoung-Ho Kim, Hwaseong-si (KR);
Seong-Jin Jang, Seongnam-si (KR);
Joung-Yeal Kim, Yongin-si (KR);
Sung-Hoon Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 60 days.

(21) Appl. No.: 11/715,478

(22) Filed: Mar. 8, 2007

(65) Prior Publication Data

US 2007/0211556 A1    Sep. 13, 2007

(30) Foreign Application Priority Data

Mar. 8, 2006   (KR) ...................... 10-2006-0021710
Sep. 25, 2006  (KR) ...................... 10-2006-0092619

(51) Int. Cl.
G11C 8/00        (2006.01)

(52) U.S. Cl. .............................. 365/230.08; 365/233.1; 365/230.03

(58) Field of Classification Search ............ 365/230.08, 365/233, 230.03, 233.16, 191
See application file for complete search history.

(56) References Cited

U.S. PATENT DOCUMENTS 5,892,730 A * 4/1999 Sato et al. ............... 365/233.16

5,978,884 A   11/1999 Yamaguchi et al.
6,212,126 B1 * 4/2001 Sakamoto ............... 365/233.14
7,397,727 B2 * 7/2008 Schnell et al. ............... 365/239

(Continued)

FOREIGN PATENT DOCUMENTS

JP        2004-206751        7/2004

(Continued)

*Primary Examiner*—David Lam
(74) *Attorney, Agent, or Firm*—Harness, Dickey & Pierce, P.L.C.

(57) ABSTRACT

An input latency control circuit, a semiconductor memory device including an input latency control circuit and method thereof are provided. The example semiconductor memory device may include a clock buffer configured to generate an internal clock signal based on an external clock signal, a command decoder configured to decode an external command signal to generate a write command signal and an input latency control circuit configured to gate an address signal in a pipeline mode to generate a column address signal and a bank address signal based on the internal clock signal, the write command signal and the write latency signal. The example input latency control circuit may include a master circuit configured to generate a column control signal and a first write address control signal based on an internal clock signal, a write command signal and a write latency signal, at least one column slave circuit configured to gate a first address signal in a pipeline mode to generate a column address signal in response to the column control signal and one of the first write address control signal and a second write address control signal and at least one bank slave circuit configured to gate a second address signal in the pipeline mode to generate the bank address signal in response to the column control signal and at least one of the first and second write address control signals.

47 Claims, 20 Drawing Sheets

U.S. PATENT DOCUMENTS

2008/0123452 A1* 5/2008 Kim .......................... 365/203

FOREIGN PATENT DOCUMENTS

| KR | 1022030046128 A | 6/2003 |
| KR | 1020040043700 A | 5/2004 |
| KR | 1020040074283 A | 8/2004 |
| KR | 1020040107706 A | 12/2004 |

* cited by examiner

INPUT LATENCY CONTROL CIRCUIT, A SEMICONDUCTOR MEMORY DEVICE INCLUDING AN INPUT LATENCY CONTROL CIRCUIT AND METHOD THEREOF

PRIORITY STATEMENT

This application claims priority under 35 USC § 119 to Korean Patent Application No. 2006-21710, filed on Mar. 8, 2006, and Korean Patent Application No. 2006-92619, filed on Sep. 25, 2006, in the Korean Intellectual Property Office (KIPO), the disclosures of which are incorporated herein in their entirety by reference.

BACKGROUND OF THE INVENTION

1. Field of the Invention

Example embodiments of the present application relate generally to an input latency control circuit, a semiconductor memory device including an input latency control circuit and method thereof, and more particularly to an input latency control circuit, a semiconductor memory device including an input latency control circuit and method for controlling latency.

2. Description of the Related Art

A synchronized semiconductor memory device may receive data and/or output data in synchronization with an external clock. A double data rate (DDR) dynamic random access memory (DRAM) may include a write latency (WL) control circuit or an additive latency (AL) control circuit to increase an efficiency of address bus lines and/or command bus lines.

A conventional semiconductor memory device including an input latency control circuit may activate internal command signals and/or address signals a number of clock cycles corresponding to a latency of the semiconductor memory device after the semiconductor memory device receives a command, such as a read command or a write command, from a memory controller. Therefore, a circuit that delays the address signals or the command signals by WL, AL, or WL+AL may be included.

FIG. 1 is a circuit diagram illustrating a conventional input latency control circuit 100.

Referring to FIG. 1, the conventional input latency control circuit 100 may include registers 111 to 117 and multiplexers 121 to 127 that are connected in series. A write latency signal (WLi, i=1~7) may correspond to a given write latency that may be set according to an operation speed of the semiconductor memory device. For example, if the write latency is seven, only WL7 may be activated and other signals (WLi, i=1, 2, 3, 4, 5, 6) may be inactivated. Therefore, if the write latency is seven, an address signal Ai may be output as a column address signal CAi through seven registers 111, 112, 113, 114, 115, 116 and 117. Further, if the write latency is four, an address signal Ai may be output as a delayed address signal CAi through four registers 114, 115, 116 and 117.

Referring to FIG. 1, the conventional input latency control circuit 100 may generate the column address signal CAi that is used to activate corresponding column selection line, after the input latency WL from a time point at which an external command signal, such as a write command, is applied. Therefore, in the conventional input latency control circuit, a number of registers corresponding to the maximum input latency may be required for each bit of an address signal. Generally, a register may be implemented with a flip-flop. For example, the conventional input latency control circuit may include a number of flip-flops corresponding to an input latency of a semiconductor memory device. A column address may be generated by delaying an address signal by a given amount of latency synchronized with an internal clock signal PCLK.

Referring to FIG. 1, the conventional input latency control circuit 100 may include a relatively high number of flip-flops. Therefore, a semiconductor memory device including the input latency control circuit may have a relatively high power consumption and may occupy a greater area in the semiconductor integrated circuit.

As the operating frequency of DRAMs increase (e.g., over 800 MHz), AL and WL may likewise increase (e.g., over ten), and the number of flip-flops included to control the latency of an address and a command may increase.

For example, in a DDR SDRAM having an AL of eight and a WL of ten, eight registers for Al and ten registers for WL, a total of eighteen, may be required to control the latency for each bit of the address signal having 16 bits. Further, eight registers for AL may be required for each command. For example, if five commands, such as /WE, /CS, /RAS, /CAS, and /OE, are received, the total number of registers required to control the latency for addresses and commands may become 18×16+8×5=248.

Referring to FIG. 1, if the number of registers is increased over a given threshold (e.g., two hundred registers), the area that the circuit occupies may become large and the routing of the circuit may be complicated. Further, as the size of the circuit is increased, the transmission line for a clock signal may increase. Accordingly, the delay time of the clock signal may be increased, thereby degrading performance of the device.

SUMMARY OF THE INVENTION

An example embodiment of the present invention is directed to a semiconductor memory device, including a clock buffer configured to generate an internal clock signal based on an external clock signal, a command decoder configured to decode an external command signal to generate a write command signal and an input latency control circuit configured to gate an address signal in a pipeline mode to generate a column address signal and a bank address signal based on the internal clock signal, the write command signal and the write latency signal.

Another example embodiment of the present invention is directed to a method of controlling input latency of a semiconductor memory device, including generating a column control signal and a write address control signal based on an internal clock signal, a write command signal, and a write latency signal, gating a first address signal in a pipeline mode to generate a column address signal in response to the column control signal and the write address control signal and gating a second address signal in the pipeline mode to generate a bank address signal in response to the column control signal and the write address control signal.

Another example embodiment of the present invention is directed to an input latency control circuit, including a master circuit configured to generate a column control signal and a first write address control signal based on an internal clock signal, a write command signal and a write latency signal, at least one column slave circuit configured to gate a first address signal in a pipeline mode to generate a column address signal in response to the column control signal and one of the first write address control signal and a second write address control signal and at least one bank slave circuit configured to gate a second address signal in the pipeline mode to generate the bank address signal in response to the column control signal and at least one of the first and second write address control signals.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS

Figure 1:
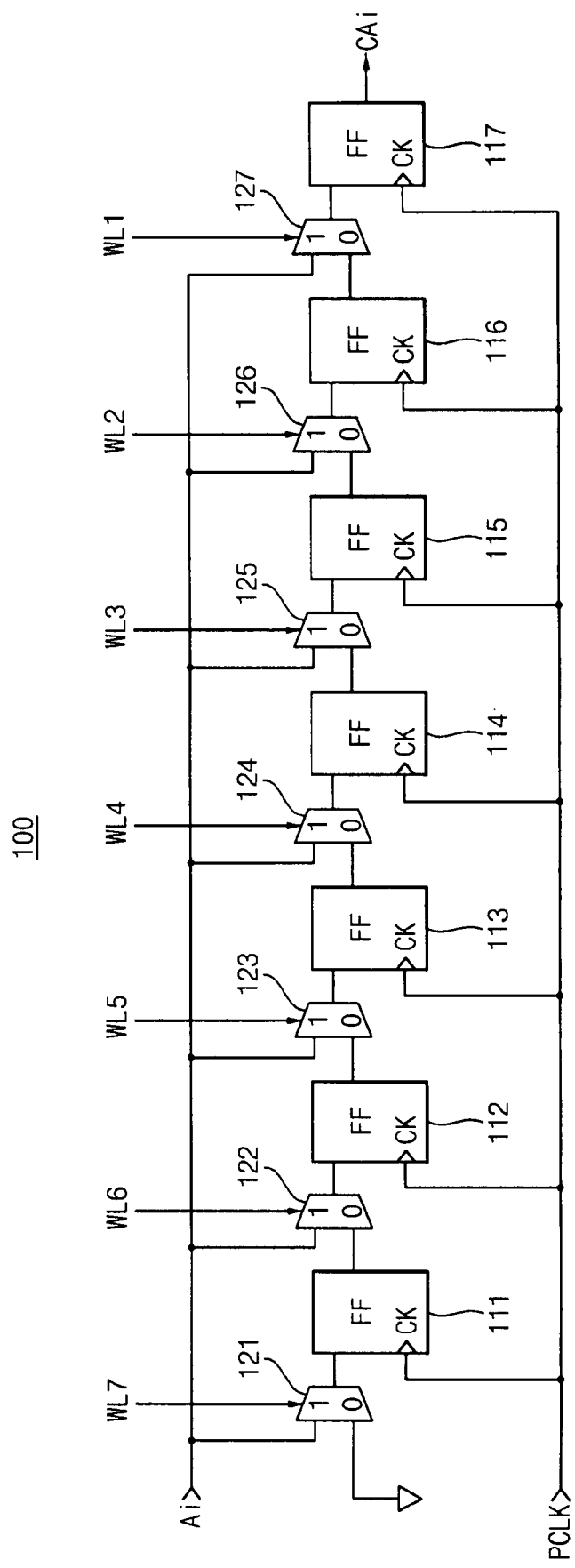
FIG. 1 is a circuit diagram illustrating a conventional input latency control circuit 100.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
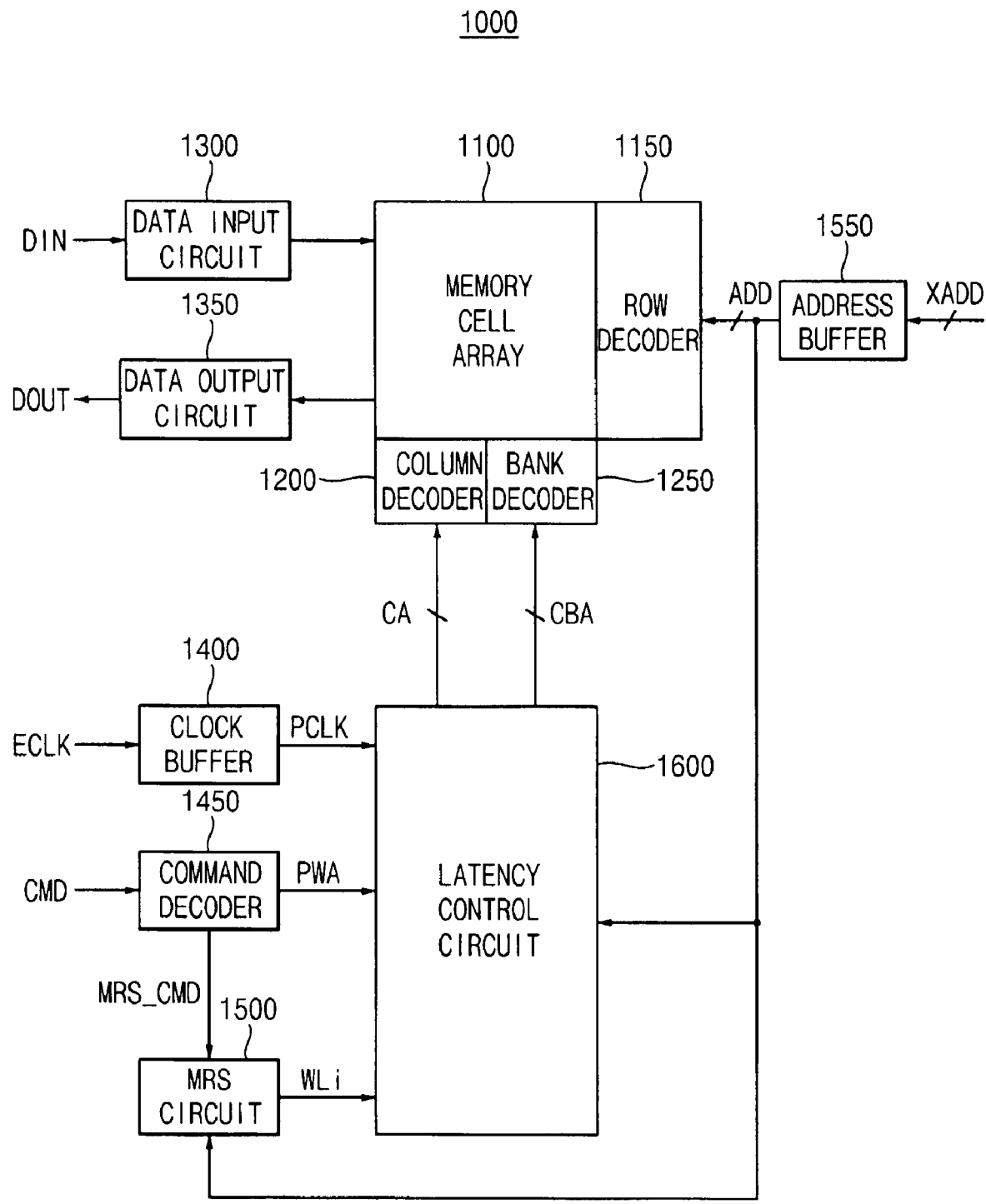
FIG. 2 is a block diagram illustrating a semiconductor memory device including an input latency control circuit according to an example embodiment of the present invention.

FIG. 2 is a block diagram illustrating a semiconductor memory device 100 according to an example embodiment of the present invention.

In the example embodiment of FIG. 2, the semiconductor memory device 100 may include a memory cell array 1100, an address buffer 1550, a row decoder 1150, a column decoder 1200, a bank decoder 1250, a data input circuit 1300, a data output circuit 1350, a clock buffer 1400, a command decoder 1450, a mode register set (MRS) circuit 1500, and an input latency control circuit 1600.

In the example embodiment of FIG. 2, the memory cell array 1100 may include a plurality of memory cells arranged in a matrix configuration. The data input circuit 1300 may buffer an input data DIN, and may write the buffered data in the memory cell array 1100 in response to an internal address signal ADD. The output circuit 1350 may buffer data outputted from the memory cell array 1100 to generate an output data DOUT. The address buffer 1550 may receive an external address XADD, and may buffer the external address XADD to generate an internal address signal ADD. The row decoder 1150 may decode the internal address signal ADD to generate a decoded row address signal. The column decoder 1200 may receive a column address signal CA from the input latency control circuit 1600, and may decode the column address signal CA to generate a decoded column address signal. The bank decoder 1250 may receive a bank address signal CBA from the input latency control circuit 1600, and may decode the bank address signal CBA to generate a decoded bank address signal that is used for assigning a memory bank.

In the example embodiment of FIG. 2, the clock buffer 1400 may receive an external clock signal ECLK, and may buffer the external clock signal to generate an internal clock signal PCLK. The command decoder 1450 may receive a command signal CMD (e.g., /WE, /CS, /RAS, /CAS) and may decode the command signal CMD to generate a decoded command signal (e.g., PWA).

In the example embodiment of FIG. 2, the MRS circuit 1500 may set a mode register set in response to an MRS command MRS_CMD, which may be used for determining an operation mode of a semiconductor memory device, and an internal address signal ADD. Input latencies, including write latency WLi and additional latency ALj, may be set by the MRS circuit 1500 in response to the MRS command MRS_CMD. For example, i and j may be natural numbers (e.g., positive integers). The MRS circuit 1500 may generate an input latency signal WLi based on the write latency WL.

In the example embodiment of FIG. 2, the input latency control circuit 1600 may perform gating on an internal address signal ADD in a pipeline mode to generate a column address signal CA and a bank address signal CBA based on the internal clock signal PCLK, the write command signal PWA, and the write latency signal WLi.

In the example embodiment of FIG. 2, the input latency control circuit 1600 may control a time point of generating the column address signal CA and the bank address signal CBA according to the write latency signal WLi and the additional latency Alj.

Figure 3:
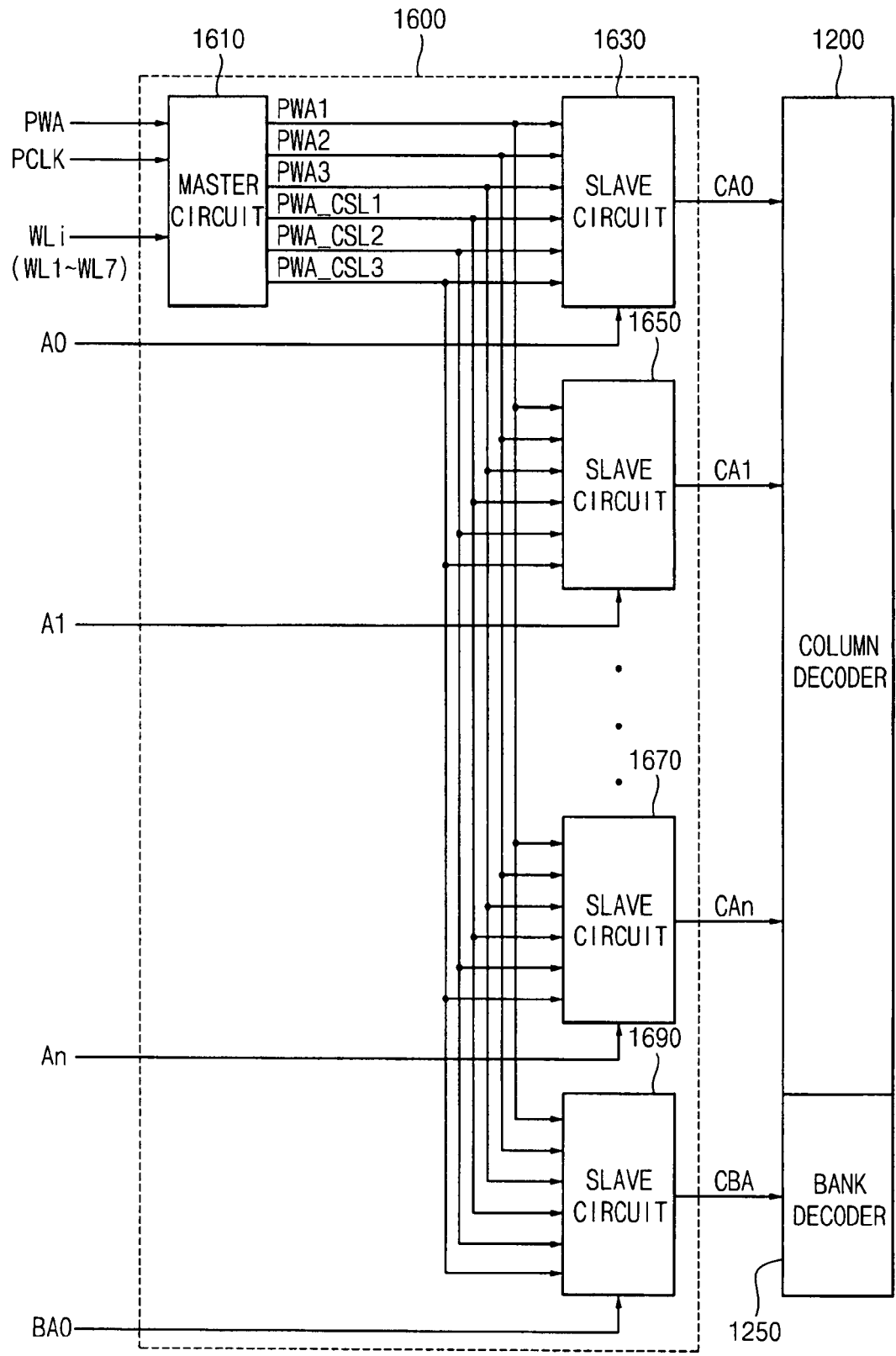
FIG. 3 is a block diagram illustrating the input latency control circuit of FIG. 2 according to another example embodiment of the present invention.

FIG. 3 is a block diagram illustrating the input latency control circuit 1600 of FIG. 2 according to another example embodiment of the present invention. In an example, in FIG. 3, a maximum value of the input latency may be seven and the burst length may be eight.

In the example embodiment of FIG. 3, the input latency control circuit 1600 may include a master circuit 1610, a first column slave circuit 1630, a second column slave circuit 1650, an (n+1)th column slave circuit 1670 and a bank slave circuit 1690. The input latency control circuit 1600 may control a time point of generating a column address signal CA having (n+1) bits <0:n> and the bank address signal CBA according to the write latency signal WL1 to WL7. For example, the input latency control circuit 1600 may control a time point of activating the column address signal CA and the bank address signal CBA by delaying address signals A0 to An and BA0 by a delay time corresponding to the write latency signal WLi.

In the example embodiment of FIG. 3, the master circuit 1610 may generate a column control signal having three bits PWA_CSL1, PWA_CSL2, and PWA_CSL3 and a write address control signal having three bits PWA1, PWA2, and PWA3 based on the internal clock signal PCLK, the write command signal PWA, and the write latency signal having seven bits WL1 to WL7.

In the example embodiment of FIG. 3, the first column slave circuit 1630 may perform gating on a first bit A0 of the internal address signal ADD in the pipeline mode to generate a first bit CA0 of the column address signal in response to the column control signal having three bits PWA_CSL1, PWA_CSL2, and PWA_CSL3 and the write address control signal having three bits PWA1, PWA2, and PWA3. The second column slave circuit 1650 may perform gating on a second bit A1 of the internal address signal ADD in the pipeline mode to generate a second bit CA1 of the column address signal in response to the column control signal having three bits PWA_CSL1, PWA_CSL2, and PWA_CSL3 and the write address control signal having three bits PWA1, PWA2, and PWA3. The (n+1)th column slave circuit 1670 may perform gating on an (n+1)th bit An of the internal address signal ADD in the pipeline mode to generate an (n+1)th bit CAn of the column address signal in response to the column control signal having three bits PWA_CSL1, PWA_CSL2, and PWA_CSL3 and the write address control signal having three bits PWA1, PWA2, and PWA3. The bank slave circuit 1690 may perform gating on a bit BA0 of the internal address signal ADD in the pipeline mode to generate a bit CBA of the bank address signal in response to the column control signal having three bits PWA_CSL1, PWA_CSL2, and PWA_CSL3 and the write address control signal having three bits PWA1, PWA2, and PWA3. In an example, the bit BA0 of the internal address signal ADD may be a bit used for bank selection. The column control signal CA0 to CAn may be provided to the column decoder 1200, and the bank address signal CBA may be provided to the bank decoder 1250.

In the example embodiment of FIG. 3, only one bank slave circuit 1690 for generating the bank address signal CBA is illustrated. However, it is understood that the bank address signal may include any number of bits, and a plurality of slave circuits for generating the bank address signal having a plurality of bits may be included in the input latency control circuit 1600.

Figure 4:
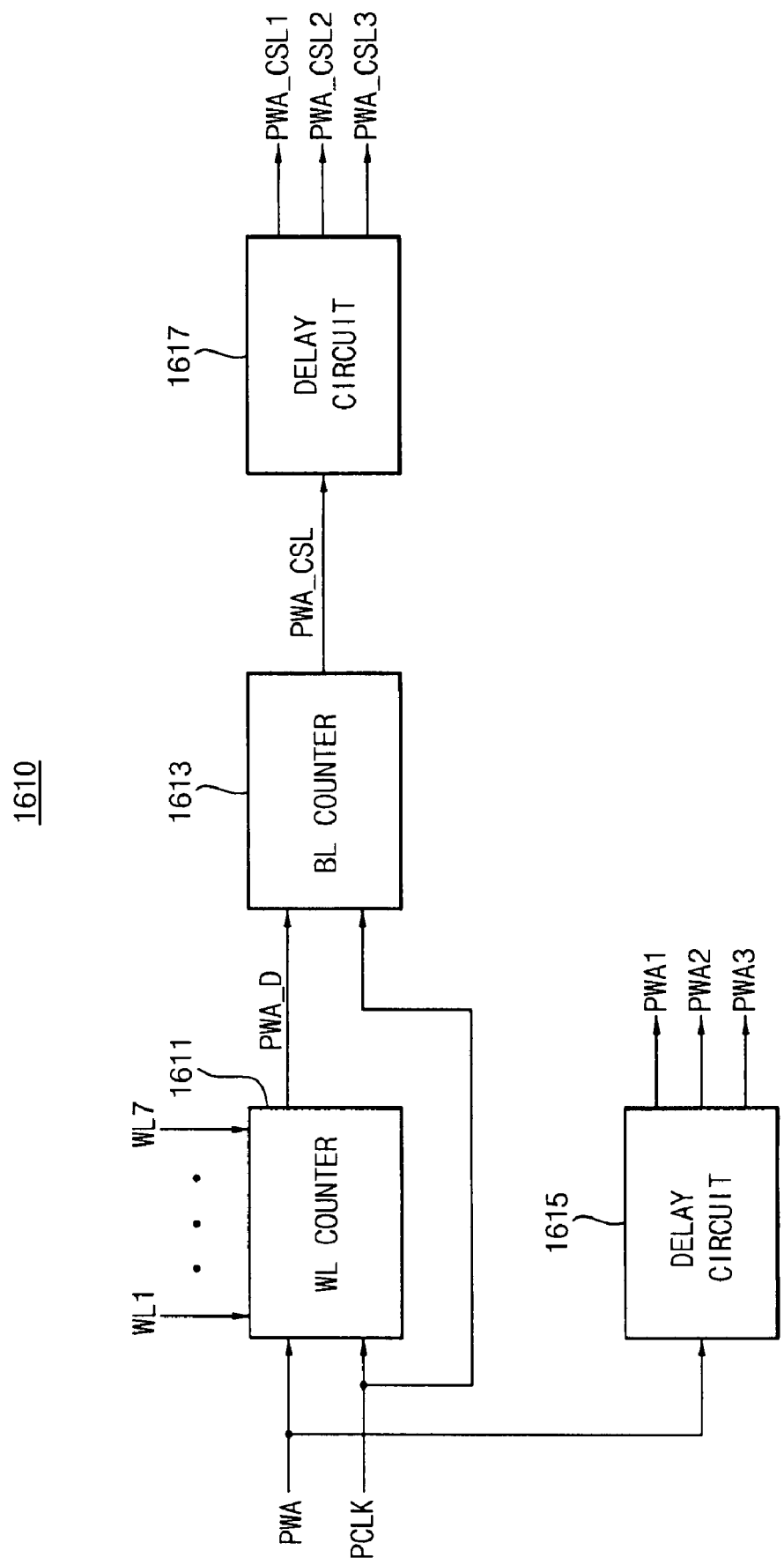
FIG. 4 is a block diagram illustrating a master circuit in the input latency control circuit of FIG. 3 according to another example embodiment of the present invention.

FIG. 4 is a block diagram illustrating the master circuit 1610 in the input latency control circuit 1600 of FIG. 3 according to another example embodiment of the present invention.

In the example embodiment of FIG. 4, the master circuit 1610 may include a write latency counter 1611, a burst length counter 1613, a first delay circuit 1615 and a second delay circuit 1617. The write latency counter 1611 may delay the write command signal PWA to generate a first signal PWA_D in response to the internal clock signal PCLK and the write latency signal WL1 to WL7. The burst length counter 1613 may delay the first signal PWA_D by a burst length (BL) to generate a second signal PWA_CSL in response to the internal clock signal PCLK. The first delay circuit 1615 may generate the write address control signal having a plurality of bits PWA1, PWA2, and PWA3 in response to the write command signal PWA. The neighboring bits of the plurality of bits PWA1, PWA2, and PWA3 may have a phase difference corresponding to a period of the write command signal PWA. The second delay circuit 1617 may generate the column control signal having a plurality of bits in response to the second signal. The neighboring bits of the plurality of bits PWA_CSL1, PWA_CSL2, and PWA_CSL3 may have a phase difference corresponding to a period of the second signal PWA_CSL.

Figure 5:
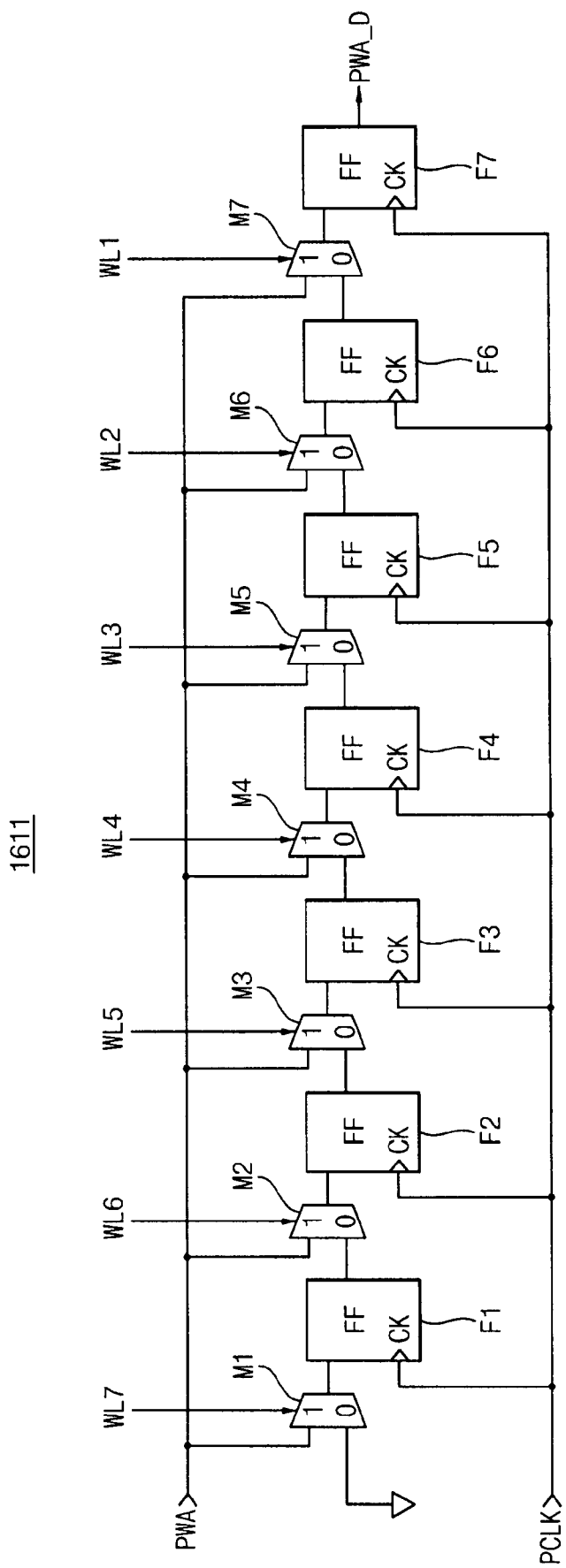
FIG. 5 is a circuit diagram illustrating a write latency counter in the master circuit of FIG. 4 according to another example embodiment of the present invention.

FIG. 5 is a circuit diagram illustrating the write latency counter 1611 in the master circuit 1610 of FIG. 4 according to another example embodiment of the present invention.

In the example embodiment of FIG. 5, the write latency counter 1611 may include a first multiplexer M1, a second multiplexer M2, a third multiplexer M3, a fourth multiplexer M4, a fifth multiplexer M5, a sixth multiplexer M6, a seventh multiplexer M7, a first flip-flop F1, a second flip-flop F2, a third flip-flop F3, a fourth flip-flop F4, a fifth flip-flop F5, a sixth flip-flop F6, and a seventh flip-flop F7. In an example, each of the flip-flops F1 to F7 may be embodied as D-type flip-flops.

In the example embodiment of FIG. 5, the first multiplexer M1 may select one of the write command signal PWA and the ground voltage in response to a first bit WL7 of the write latency signal. The first flip-flop F1 may latch an output signal of the first multiplexer M1 in response to the internal clock signal PCLK.

In the example embodiment of FIG. 5, the second multiplexer M2 may select one of the write command signal PWA and the ground voltage in response to a second bit WL6 of the write latency signal. The second flip-flop F2 may latch an output signal of the second multiplexer M2 in response to the internal clock signal PCLK.

In the example embodiment of FIG. 5, the third multiplexer M3 may select one of the write command signal PWA and the ground voltage in response to a third bit WL5 of the write latency signal. The third flip-flop F3 may latch an output signal of the third multiplexer M3 in response to the internal clock signal PCLK. The fourth multiplexer M4 may select one of the write command signal PWA and the ground voltage in response to a fourth bit WL4 of the write latency signal. The fourth flip-flop F4 may latch an output signal of the fourth multiplexer M4 in response to the internal clock signal PCLK.

In the example embodiment of FIG. 5, the fifth multiplexer M5 may select one of the write command signal PWA and the ground voltage in response to a fifth bit WL3 of the write latency signal. The fifth flip-flop F5 may latch an output signal of the fifth multiplexer M5 in response to the internal clock signal PCLK. The sixth multiplexer M6 may select one of the write command signal PWA and the ground voltage in response to a sixth bit WL2 of the write latency signal. The sixth flip-flop F6 may latch an output signal of the sixth multiplexer M6 in response to the internal clock signal PCLK.

In the example embodiment of FIG. 5, the seventh multiplexer M7 may select one of the write command signal PWA and the ground voltage in response to a seventh bit WL1 of the write latency signal. The seventh flip-flop F7 may latch an output signal of the seventh multiplexer M7 in response to the internal clock signal PCLK.

Hereinafter, example operation of the write latency counter 1611 of FIG. 5 will be described in greater detail.

In example operation of the write latency counter 1611 of FIG. 5, the number of flip-flops included in the write latency counter 1611 may be determined by a maximum value of input latency. For example, if the maximum value of the write latency is M, the number of flip-flops of the write latency counter 1611 may be M. In the example embodiment of FIG. 5, in an example, the maximum value of the input latency may be 7. Hereinafter, 1 tCK may denote one clock cycle or a period of the internal clock signal PCLK.

In example operation of the write latency counter 1611 of FIG. 5, if the input latency is 7, the write command signal PWA may be input to an input terminal of the first flip-flop F1 and may pass through the second flip-flop F2, the third flip-flop F3, the fourth flip-flop F4, the fifth flip-flop F5, the sixth flip-flop F6, and the seventh flip-flop F7. Therefore, the output signal PWA_D of the write latency counter 1611 may generated a number of clock cycles, corresponding to the input latency, after the write command signal PWA. For example, the output signal PWA_D of the write latency counter 1611 may be generated 7 tCK after the write command signal PWA.

In example operation of the write latency counter 1611 of FIG. 5, if the input latency is 6, the write command signal PWA may be input to an input terminal of the second flip-flop F2 and may pass through the third flip-flop F3, the fourth flip-flop F4, the fifth flip-flop F5, the sixth flip-flop F6, and the seventh flip-flop F7. Therefore, the output signal PWA_D of the write latency counter 1611 may be generated a number of clock cycles, corresponding to the input latency, after the write command signal PWA. For example, the output signal PWA_D of the write latency counter 1611 may be generated six tCK after the write command signal PWA.

In example operation of the write latency counter 1611 of FIG. 5, if the input latency is set to another value (e.g., five, four, three, two, one, etc.), the output signal PWA_D of the write latency counter 1611 may be generated a number of clock cycles, corresponding to the input latency, after the write command signal PWA.

Figure 6:
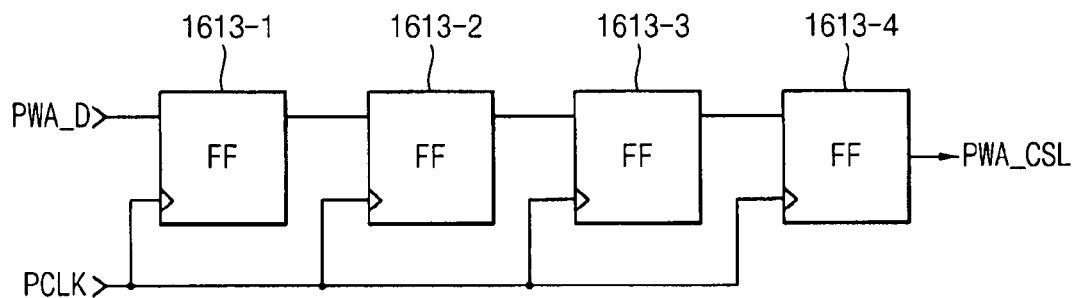
FIG. 6 is a circuit diagram illustrating a burst length counter in the master circuit of FIG. 4 according to another example embodiment of the present invention.

FIG. 6 is a circuit diagram illustrating the burst length counter 1613 in the master circuit 1610 of FIG. 4 according to another example embodiment of the present invention. In the example embodiment of FIG. 6, the burst length counter 1613 may include a first flip-flop 1613*a*, a second flip-flop 1613*b*, a third flip-flop 1613*c*, and a fourth flip-flop 1613*d*.

In the example embodiment of FIG. 6, the first flip-flop 1613a may latch the first signal PWA_D in response to the internal clock signal PCLK. The second flip-flop 1613b may latch an output signal of the first flip-flop 1613a in response to the internal clock signal PCLK. The third flip-flop 1613c may latch an output signal of the second flip-flop 1613b in response to the internal clock signal PCLK. The fourth flip-flop 1613d may latch an output signal of the third flip-flop 1613c to output the second signal PWA_CSL in response to the internal clock signal PCLK.

In the example embodiment of FIG. 6, in an example, the burst length counter 1613 may be included in a semiconductor memory device if the burst length (BL) is eight, that is, if the semiconductor memory device has an operation mode of 8-bit pre-fetch. As shown in the example embodiment of FIG. 6, four flip-flops 1613a, 1613b, 1613c, and 1613d may be included BL is eight. However, if a double-pump address skim is used, the burst length counter having a burst length of eight may be designed using, for example, three flip-flops.

Figure 7:
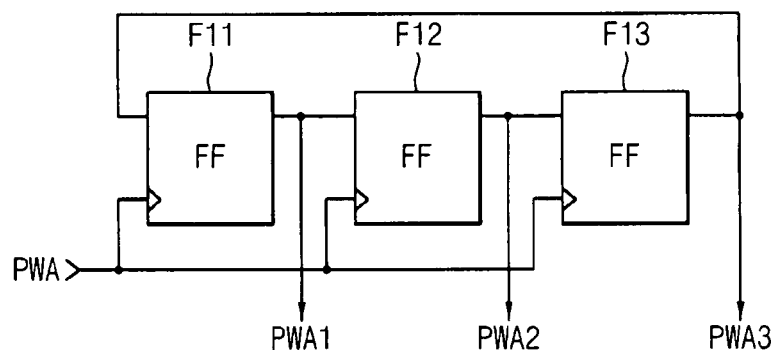
FIG. 7 is a circuit diagram illustrating a first delay circuit in the master circuit of FIG. 4 according to another example embodiment of the present invention.

FIG. 7 is a circuit diagram illustrating the first delay circuit 1615 in the master circuit 1610 of FIG. 4 according to another example embodiment of the present invention. In the example embodiment of FIG. 7, the first delay circuit 1615 may include a fifth flip-flop F11, a sixth flip-flop F12, and a seventh flip-flop F13.

In the example embodiment of FIG. 7, the fifth flip-flop F11 may latch a signal of an input terminal to generate a first bit PWA1 of the write address control signal in response to the write command signal PWA. The sixth flip-flop F12 may latch the first bit PWA1 of the write address control signal to generate a second bit PWA2 of the write address control signal in response to the write command signal PWA. The seventh flip-flop F13 may latch the second bit PWA2 of the write address control signal to generate a third bit PWA3 of the write address control signal in response to the write command signal PWA. An output terminal of the seventh flip-flop F13 may be electrically coupled to the input terminal of the fifth flip-flop F11.

In the example embodiment of FIG. 7, the first delay circuit 1615 may generate the write address control signal having a plurality of bits PWA1, PWA2, and PWA3 in response to the write command signal PWA. The neighboring bits of the plurality of bits PWA1, PWA2, and PWA3 may have a phase difference corresponding to a period of the write command signal PWA.

Figure 8:
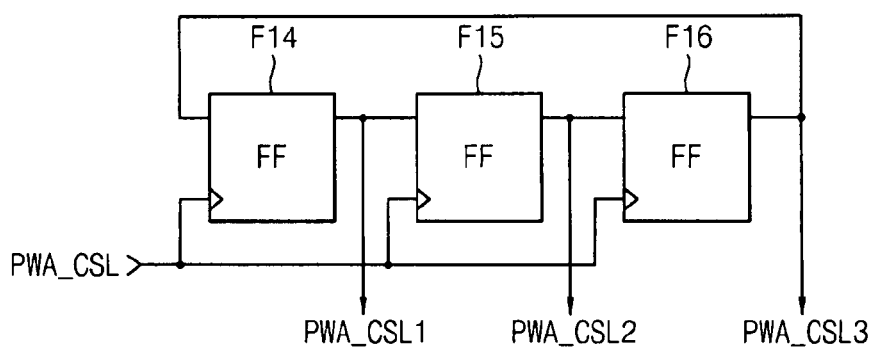
FIG. 8 is a circuit diagram illustrating a second delay circuit in the master circuit of FIG. 4 according to another example embodiment of the present invention.

FIG. 8 is a circuit diagram illustrating the second delay circuit 1617 in the master circuit 1610 of FIG. 4 according to another example embodiment of the present invention. In the example embodiment of FIG. 8, the second delay circuit 1617 may include an eighth flip-flop F14, a ninth flip-flop F15, and a tenth flip-flop F16.

In the example embodiment of FIG. 8, the eighth flip-flop F14 may latch a signal of an input terminal to generate a first bit PWA_CSL1 of the column control signal in response to the second signal PWA_CSL. The ninth flip-flop F15 may latch the first bit PWA_CSL1 of the column control signal to generate a second bit PWA_CSL2 of the column control signal in response to the second signal PWA_CSL. The tenth flip-flop F16 may latch the second bit PWA_CSL2 of the column control signal to generate a third bit PWA_CSL3 of the column control signal in response to the second signal. An output terminal of the tenth flip-flop F16 may be electrically coupled to the input terminal of the eighth flip-flop F14.

In the example embodiment of FIG. 8, the second delay circuit 1617 may generate the column control signal having a plurality of bits PWA_CSL1, PWA_CSL2, and PWA_CSL3 in response to the second signal PWA_CSL. The neighboring bits of the plurality of bits PWA_CSL1, PWA_CSL2, and PWA_CSL3 may have a phase difference corresponding to a period of the second signal PWA_CSL.

Figure 9:
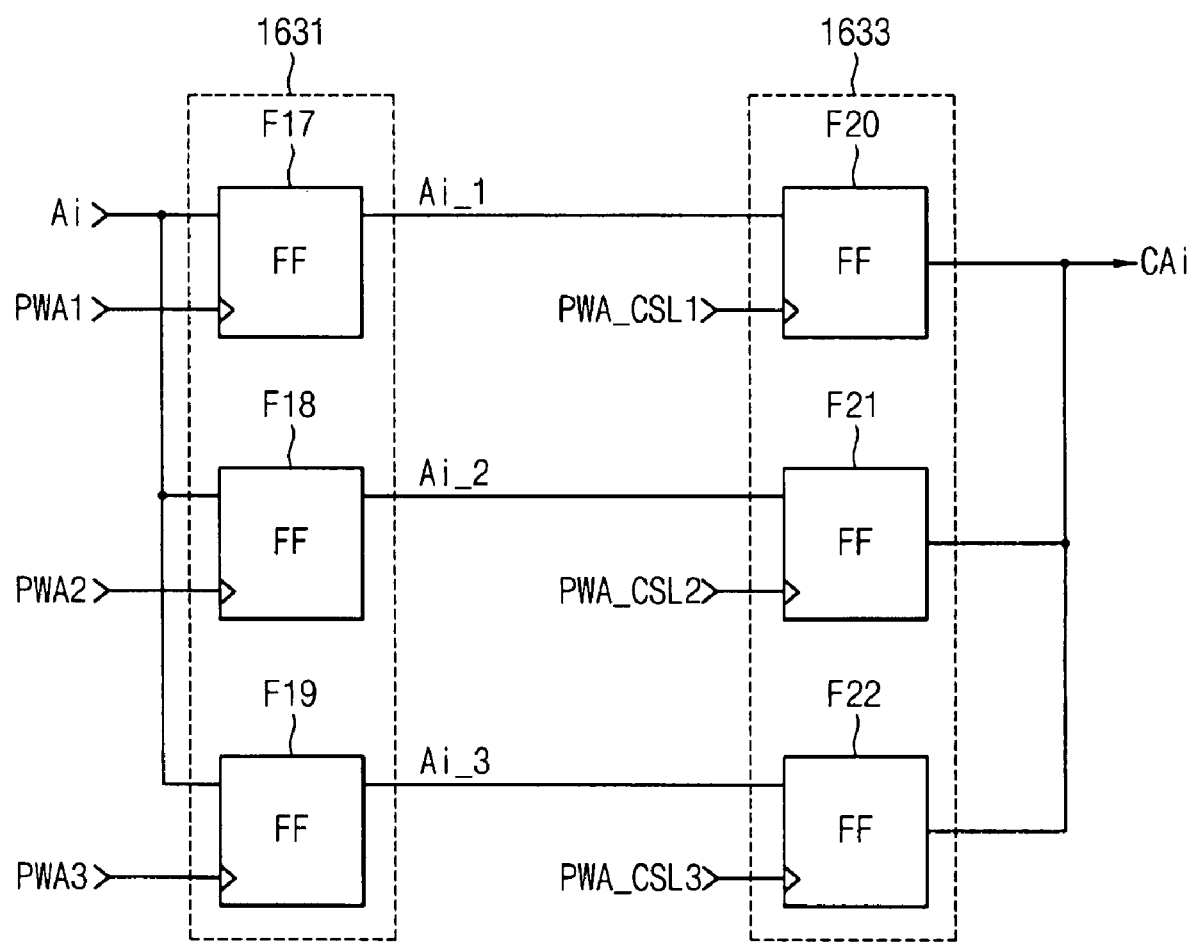
FIG. 9 is a circuit diagram illustrating a column slave circuit configured to generate a column address in the input latency control circuit of FIG. 3 according to another example embodiment of the present invention.

FIG. 9 is a circuit diagram illustrating one of the column slave circuits 1630 configured to generate a column address in the input latency control circuit 1600 of FIG. 3 according to another example embodiment of the present invention. In the example embodiment of FIG. 9, the first column slave circuit 1630 may include a first gating circuit 1631 and a second gating circuit 1633.

In the example embodiment of FIG. 9, the first gating circuit 1631 may latch a first bit Ai of the first address signal to generate a first gating signal Ai_1, Ai_2, and Ai_3 in response to the write address control signal PWA1, PWA2, and PWA3. The second gating circuit 1633 may latch the first gating signal Ai_1, Ai_2, and Ai_3 to generate a bit CAi of the column address signal in response to the column control signal PWA_CSL1, PWA_CSL2, and PWA_CSL3.

In the example embodiment of FIG. 9, the first gating circuit 1631 may include a first flip-flop F17, a second flip-flop F18, and a third flip-flop F19. The first flip-flop F17 may latch the first bit Ai of the first address signal to generate the first bit Ai_1 of the first gating signal in response to the first bit PWA1 of the write address control signal. The second flip-flop F18 may latch the first bit Ai of the first address signal to generate a second bit Ai_2 of the first gating signal in response to a second bit PWA_2 of the write address control signal. The third flip-flop F19 may latch the first bit Ai of the first address signal to generate a third bit Ai_3 of the first gating signal in response to a third bit PWA3 of the write address control signal.

In the example embodiment of FIG. 9, the second gating circuit 1633 may include a fourth flip-flop F20, a fifth flip-flop F21, and a sixth flip-flop F22. The fourth flip-flop F20 latches the first bit Ai_1 of the first gating signal to generate the bit CAi of the column address signal in response to a first bit PWA_CSL1 of the column control signal. The fifth flip-flop F21 may latch the second bit Ai_2 of the first gating signal to generate the bit CAi of the column address signal in response to a second bit PWA_CSL2 of the column control signal. The sixth flip-flop F22 may latch the third bit Ai_3 of the first gating signal to generate the bit CAi of the column address signal in response to a third bit PWA_CSL3 of the column control signal. Output terminals of the flip-flops F20, F21, and F22 may be electrically coupled to each other.

In the example embodiment of FIG. 9, each of the column slave circuits 1630, 1650, and 1670 may perform gating on one bit of the internal address signal ADD in the pipeline mode to generate one bit of the column address signal in response to the column control signal having three bits PWA_CSL1, PWA_CSL2, and PWA_CSL3 and the write address control signal having three bits PWA1, PWA2, and PWA3. In an example, PWA1 and PWA_CSL1 may be generated as a pair (e.g., "in pair"), PWA2 and PWA_CSL2 may be generated in pair, and PWA3 and PWA_CSL3 may be generated in pair.

Figure 10:
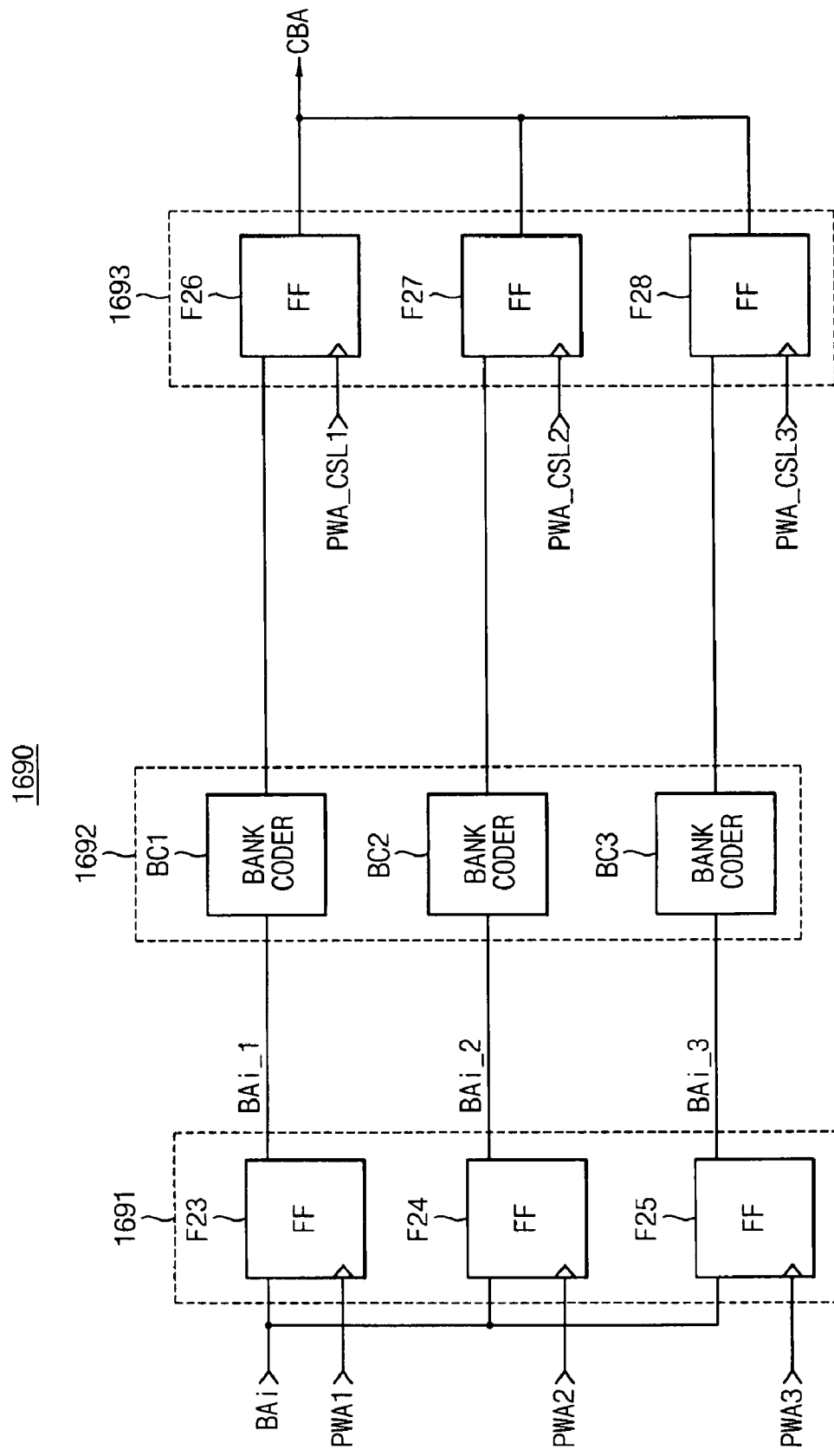
FIG. 10 is a circuit diagram illustrating a bank slave circuit configured to generate bank addresses in the input latency control circuit of FIG. 3 according to another example embodiment of the present invention.

FIG. 10 is a circuit diagram illustrating the bank slave circuit 1690 configured to generate bank addresses in the input latency control circuit 1600 of FIG. 3 according to another example embodiment of the present invention. In the example embodiment of FIG. 10, the bank slave circuit 1690 may include a first gating circuit 1691, a bank coding circuit 1692, and a second gating circuit 1693.

In the example embodiment of FIG. 10, the first gating circuit 1691 may latch a first bit BAi of the second address signal to generate a first gating signal BAi_1, BAi_2, and BAi_3 in response to the write address control signal PWA1, PWA2, and PWA3. The bank coding circuit 1692 may perform bank coding on the first gating signal BAi_1, BAi_2, and BAi_3 to generate a coding signal. The second gating circuit 1693 may latch the coding signal to generate a first bit CBA of the bank address signal in response to the column control signal PWA_CSL1, PWA_CSL2, and PWA_CSL3.

In the example embodiment of FIG. 10, the first gating circuit 1691 may include a first flip-flop F23, a second flip-flop F24, and a third flip-flop F25. The first flip-flop F23 may latch a first bit BAi of the second address signal to generate a first bit BAi_1 of the first gating signal in response to a first bit PWA1 of the write address control signal. The second flip-flop F24 may latch a first bit BAi of the second address signal to generate a second bit BAi_2 of the first gating signal in response to a second bit PWA2 of the write address control signal. The third flip-flop F25 may latch a first bit BAi of the second address signal to generate a third bit BAi_3 of the first gating signal in response to a third bit PWA3 of the write address control signal.

In the example embodiment of FIG. 10, the bank coding circuit 1692 may include a first bank coder BC1, a second bank coder BC2, and a third bank coder BC3. The first bank coder BC1 may perform the bank coding on the first bit BAi_1 of the first gating signal to generate a first bit of the coding signal. The second bank coder BC2 may perform the bank coding on the second bit BAi_2 of the first gating signal to generate a second bit of the coding signal. The third bank coder BC3 may perform the bank coding on the third bit BAi_3 of the first gating signal to generate a third bit of the coding signal.

In the example embodiment of FIG. 10, the second gating circuit 1693 may include a fourth flip-flop F26, a fifth flip-flop F27, and a sixth flip-flop F28. The fourth flip-flop F26 may latch the first bit of the coding signal to generate the first bit CBA of the bank address signal in response to a first bit of the column control signal PWA_CSL1. The fifth flip-flop F27 may latch the second bit of the coding signal to generate the first bit CBA of the bank address signal in response to a second bit of the column control signal PWA_CSL2. The sixth flip-flop F28 may latch the third bit of the coding signal to generate the first bit CBA of the bank, address signal in response to a third bit PWA_CSL3 of the column control signal. Output terminals of the flip-flops F26, F27, and F28 may be electrically coupled to each other.

In the example embodiment of FIG. 10, the bank slave circuit 1690 may perform gating on one bit of the internal address signal ADD in the pipeline mode to generate one bit of the bank address signal in response to the column control signal having three bits PWA_CSL1, PWA_CSL2, and PWA_CSL3 and the write address control signal having three bits PWA1, PWA2, and PWA3. In an example, the bit BAi of the internal address signal ADD may be used as a bit for bank selection.

Figure 11:
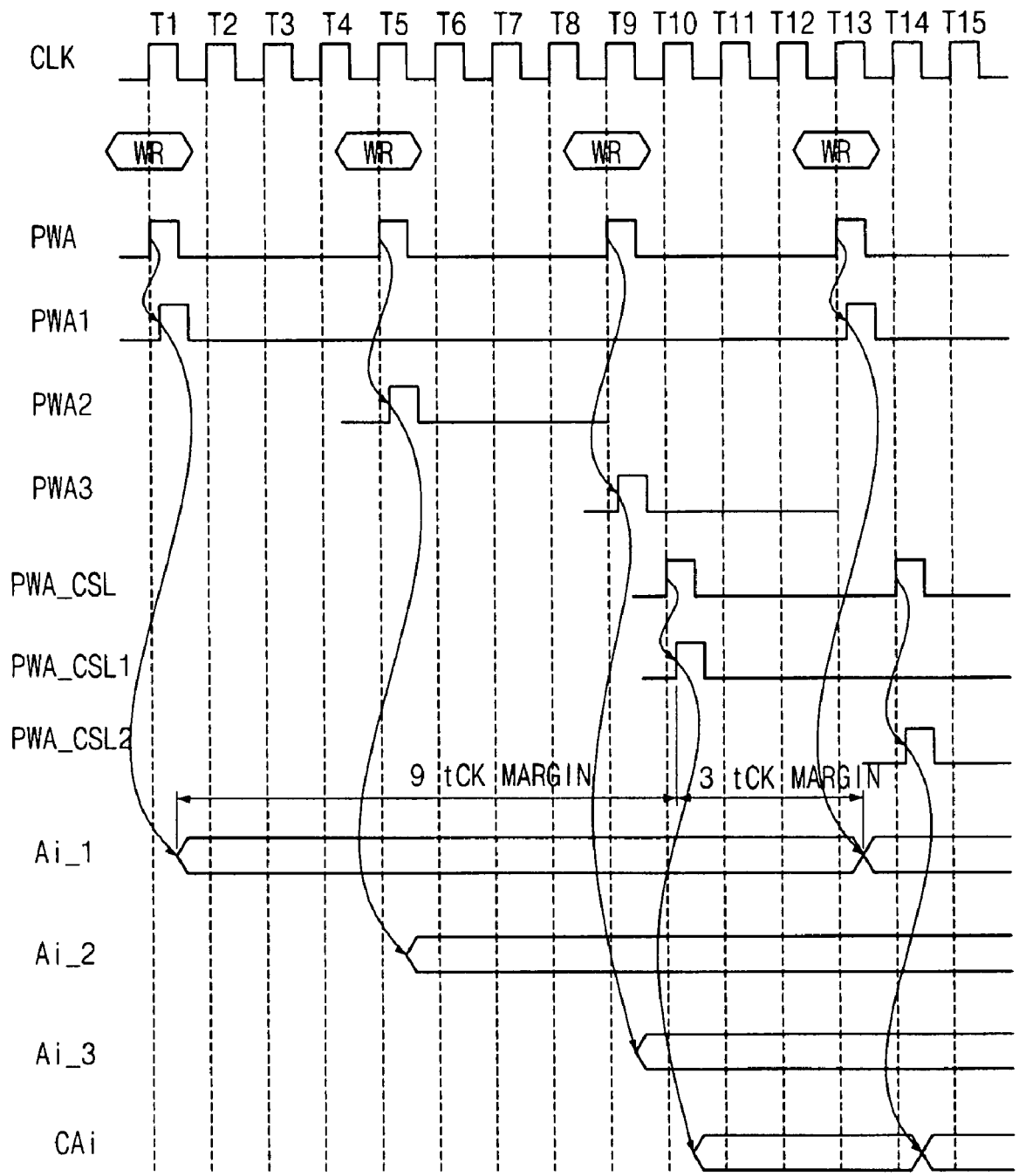
FIG. 11 is a timing diagram illustrating an operation of the input latency control circuit of FIG. 3 according to another example embodiment of the present invention.

FIG. 11 is a timing diagram illustrating an operation of the input latency control circuit 1600 of FIG. 3 according to another example embodiment of the present invention. In the example embodiment of FIG. 11, the write latency may be assumed to be seven. Also, the clock signal CLK illustrated in FIG. 11 may correspond to the internal clock signal PCLK of FIG. 4.

In the example embodiment of FIG. 11, the write command WR may be generated every four clock cycles. The write address control signal having the bits PWA1, PWA2, and PWA3 may be generated in response to the write command signal PWA. The neighboring bits of the plurality of bits PWA1, PWA2, and PWA3 may have a phase difference corresponding to a period of the write command signal PWA.

The output signal PWA_CSL of the burst length counter 1613 may be a delayed signal of the output signal PWA_D by the burst length (BL). Further, the column control signal having a plurality of bits PWA_CSL1, PWA_CSL2, and PWA_CSL3 may have a phase difference corresponding to a period of the second signal PWA_CSL. The neighboring bits of the plurality of bits PWA_CSL1, PWA_CSL2, and PWA_CSL3 may have a phase difference corresponding to a period of the second signal PWA_CSL.

In the example embodiment of FIG. 11, only PWA_CSL1 and PWA_CSL2 are illustrated for convenience of description. The output signals Ai_1, Ai_2 and Ai_3 of the gating circuit 1631 included in the first column slave circuit 1630 of FIG. 9 may be generated in response to the bits PWA1, PWA2, and PWA3 of the write address control signal, respectively. The bit CAi of the column address signal may be generated in response to the column control signal having a plurality of bits PWA_CSL1, PWA_CSL2, and PWA_CSL3.

Hereinafter, example operation of the input latency control circuit 1600 according will be described with reference to FIGS. 3 to 11.

In example operation of the input latency control circuit 1600, with reference to FIGS. 3 to 11, in a "worst" case, the margin between control signals PWA_CSL1, PWA_CSL2, and PWA_CSL3 and the effective address signals (e.g., the gating signals Ai_1, Ai_2, and Ai_3) may be three tCK. Here, tCK may denote a period of the clock signal CLK. In the conventional art, a margin between the control signals and the effective address signals may become as low as equal to or less than one tCK. However, if the margin between the control signals and the effective address signals is sufficiently large (e.g., as in at least some of the example embodiments of the present invention), the timing control of the control signals PWA_CSL1, PWA_CSL2, and PWA_CSL3 may be easier to control, and the circuit design may be simplified and a power consumption thereof may decrease.

Figure 12:
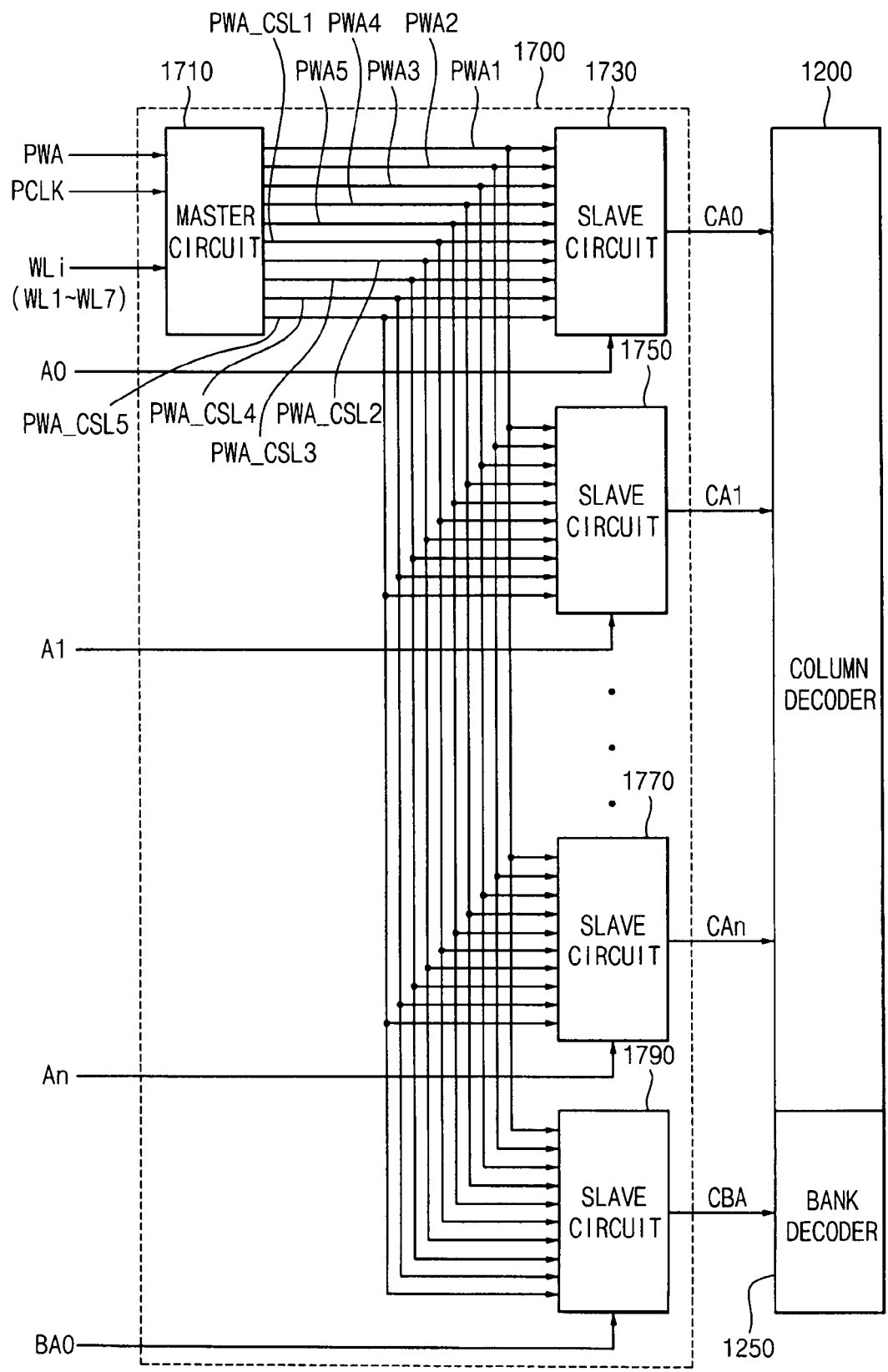
FIG. 12 is a block diagram an input latency control circuit in the semiconductor memory device of FIG. 2 according to another example embodiment of the present invention.

FIG. 12 is a block diagram an input latency control circuit 1700 in the semiconductor memory device of FIG. 2 according to another example embodiment of the present invention. In the input latency control circuit 1700 of FIG. 7, in an example, a maximum value of the input latency may be seven and the burst length may be four.

In the example embodiment of FIG. 12, the input latency control circuit 1700 may include a master circuit 1710, a first column slave circuit 1730, a second column slave circuit 1750, an (n+1)th column slave circuit 1770, and a bank slave circuit 1790. The input latency control circuit 1700 may control a time point of generating a column address signal CA having (n+1) bits <0:n> and the bank address signal CBA according to the write latency signal WL1 to WL7. For example, the input latency control circuit 1700 may control a time point of activating the column address signal CA and the bank address signal CBA by delaying address signals A0 to An and BA0 by a delay time corresponding to the write latency signal WLi.

In the example embodiment of FIG. 12, the master circuit 1710 may generate a column control signal having five bits PWA_CSL1, PWA_CSL2, PWA_CSL3, PWA_CSL4, and PWA_CSL5 and a write address control signal having five bits PWA1, PWA2, PWA3, PWA4, and PWA5 based on the internal clock signal PCLK, the write command signal PWA, and the write latency signal having seven bits WL1 to WL7.

In the example embodiment of FIG. 12, the first column slave circuit 1730 may perform gating on a first bit A0 of the internal address signal ADD in the pipeline mode to generate a first bit CA0 of the column address signal in response to the column control signal having five bits PWA_CSL1, PWA_CSL2, PWA_CSL3, PWA_CSL4, and PWA_CSL5 and the write address control signal having five bits PWA1, PWA2, PWA3, PWA4, and PWA5. The second column slave circuit 1750 may perform gating on a second bit A1 of the internal address signal ADD in the pipeline mode to generate a second bit CA1 of the column address signal in response to the column control signal having five bits PWA_CSL1, PWA_CSL2, PWA_CSL3, PWA_CSL4, and PWA_CSL5 and the write address control signal having five bits PWA1, PWA2, PWA3, PWA4, and PWA5. The (n+1)th column slave circuit 1770 may perform gating on an (n+1)th bit An of the internal address signal ADD in the pipeline mode to generate an (n+1)th bit CAn of the column address signal in response to the column control signal having five bits PWA_CSL1, PWA_CSL2, PWA_CSL3, PWA_CSL4, and PWA_CSL5 and the write address control signal having five bits PWA1, PWA2, PWA3, PWA4, and PWA5.

In the example embodiment of FIG. 12, the bank slave circuit 1790 may perform gating on a bit BA0 of the internal address signal ADD in the pipeline mode to generate a bit CBA of the bank address signal in response to the column control signal having five bits PWA_CSL1, PWA_CSL2, PWA_CSL3, PWA_CSL4, and PWA_CSL5 and the write address control signal having five bits PWA1, PWA2, PWA3, PWA4, and PWA5. In an example, the bit BA0 of the internal address signal ADD may be a bit used for bank selection. The column control signal CA0 to CAn may be provided to the column decoder 1200, and the bank address signal CBA may be provided to the bank decoder 1250.

In the example embodiment of FIG. 12, only one bank slave circuit 1790 for generating the bank address signal CBA is illustrated. However, it is understood that the bank address signal may include any number of bits, and any number of slave circuits for generating the bank address signal any number of bits may be included in the input latency control circuit 1700.

Figure 13:
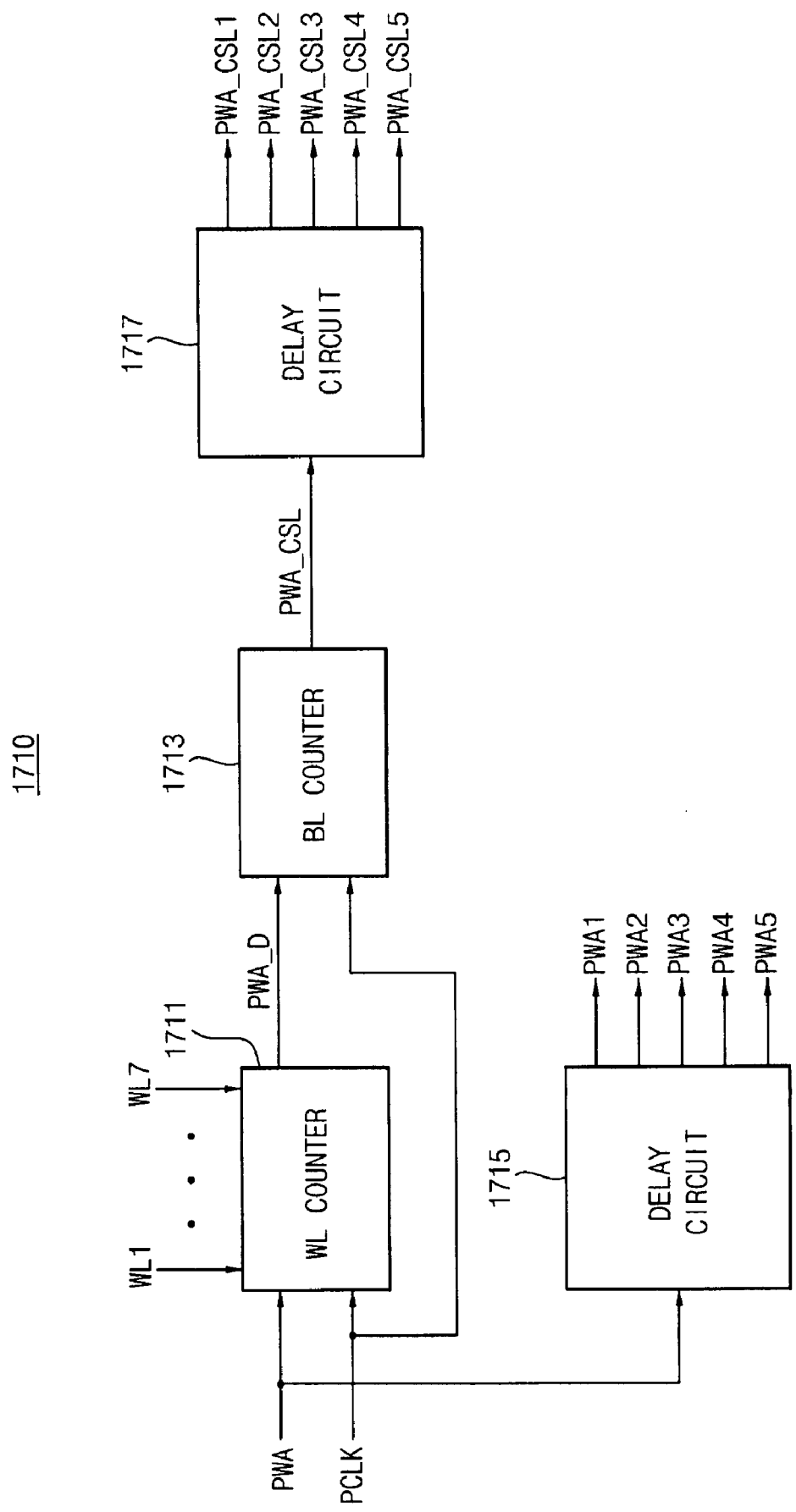
FIG. 13 is a block diagram illustrating a master circuit in the input latency control circuit of FIG. 12 according to another example embodiment of the present invention.

FIG. 13 is a block diagram illustrating the master circuit 1710 in the input latency control circuit 1700 of FIG. 12 according to another example embodiment of the present invention.

In the example embodiment of FIG. 13, the master circuit 1710 may include a write latency counter 1711, a burst length counter 1713, a first delay circuit 1715, and a second delay circuit 1717. The write latency counter 1711 may delay the write command signal PWA to generate a first signal PWA_D in response to the internal clock signal PCLK and the write latency signal WL1 to WL7. The burst length counter 1713 may delay the first signal PWA_D by a burst length (BL) to generate a second signal PWA_CSL in response to the internal clock signal PCLK. The first delay circuit 1715 may generate the write address control signal having five bits PWA1, PWA2, PWA3, PWA4, and PWA5 in response to the write command signal PWA. The neighboring bits of the five bits PWA1, PWA2, PWA3, PWA4, and PWA5 may have a phase difference corresponding to a period of the write command signal PWA. The second delay circuit 1717 may generate the column control signal having a plurality of bits in response to the second signal. The neighboring bits of the five bits PWA_CSL1, PWA_CSL2, PWA_CSL3, PWA_CSL4, and PWA_CSL5 have a phase difference corresponding to a period of the second signal PWA_CSL. In an example, the write latency counter 1711 illustrated FIG. 13 may be configured in the same manner as that of the write latency counter 1611 of FIG. 5.

Figure 14:
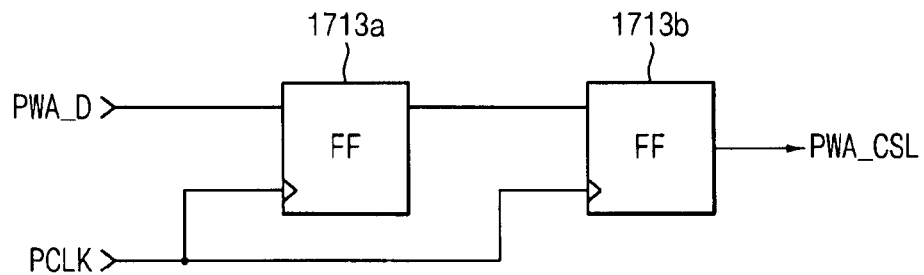
FIG. 14 is a circuit diagram illustrating a burst length counter in the master circuit of FIG. 13 according to another example embodiment of the present invention.

FIG. 14 is a circuit diagram illustrating the burst length counter 1713 in the master circuit 1710 of FIG. 13 according to another example embodiment of the present invention.

In the example embodiment of FIG. 14, the burst length counter 1713 may include a first flip-flop 1713a and a second flip-flop 1713b. The first flip-flop 1713a may latch the first signal PWA_D in response to the internal clock signal PCLK. The second flip-flop 1713b may latch an output signal of the first flip-flop 1713a to output the second signal PWA_CSL in response to the internal clock signal PCLK.

Figure 15:
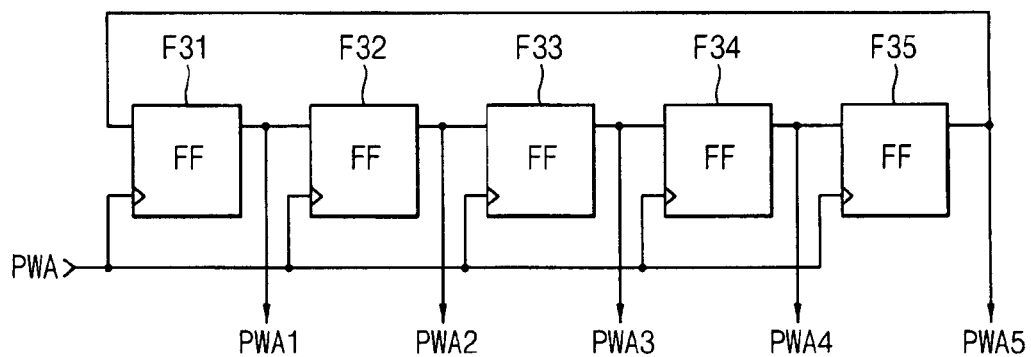
FIG. 15 is a circuit diagram illustrating a first delay circuit in the master circuit of FIG. 13 according to another example embodiment of the present invention.

FIG. 15 is a circuit diagram illustrating the first delay circuit 1715 in the master circuit 1710 of FIG. 13 according to another example embodiment of the present invention. In the example embodiment of FIG. 15, the first delay circuit 1715 may include a third flip-flop F31, a fourth flip-flop F32, a fifth flip-flop F33, a sixth flip-flop F34, and a seventh flip-flop F35.

In the example embodiment of FIG. 15, the third flip-flop F31 may latch a signal of an input terminal to generate a first bit PWA1 of the write address control signal in response to the write command signal PWA. The fourth flip-flop F32 may latch the first bit PWA1 of the write address control signal to generate a second bit PWA2 of the write address control signal in response to the write command signal PWA. The fifth flip-flop F33 may latch the second bit PWA2 of the write address control signal to generate a third bit PWA3 of the write address control signal in response to the write command signal PWA. The sixth flip-flop F34 may latch the third bit PWA3 of the write address control signal to generate a fourth bit PWA4 of the write address control signal in response to the write command signal PWA. The seventh flip-flop F35 may latch the fourth bit PWA4 of the write address control signal to generate a fifth bit PWA5 of the write address control signal in response to the write command signal PWA. An output terminal of the seventh flip-flop F35 may be electrically coupled to the input terminal of the third flip-flop F31.

Figure 16:
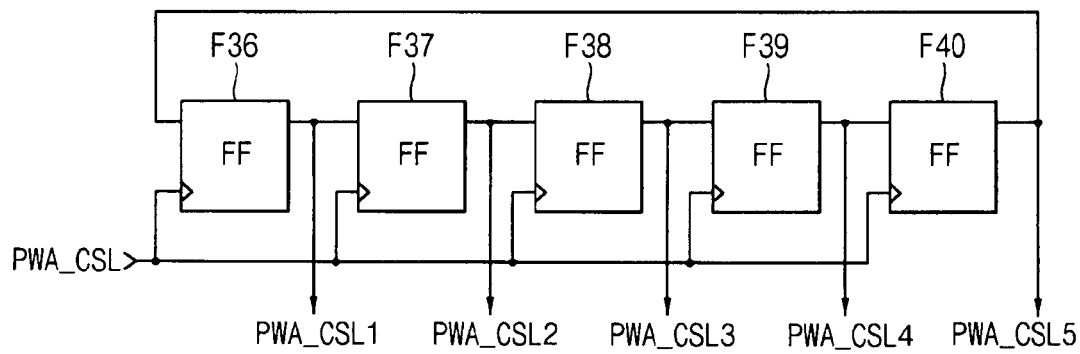
FIG. 16 is a circuit diagram illustrating a second delay circuit in the master circuit of FIG. 13 according to another example embodiment of the present invention.

FIG. 16 is a circuit diagram illustrating the second delay circuit 1717 in the master circuit 1710 of FIG. 13 according to another example embodiment of the present invention. In the example embodiment of FIG. 16, the second delay circuit 1717 may include an eighth flip-flop F36, a ninth flip-flop F37, a tenth flip-flop F38, an eleventh flip-flop F39 and a twelfth flip-flop F40.

In the example embodiment of FIG. 16, the eighth flip-flop F36 may latch a signal of an input terminal to generate a first bit PWA_CSL1 of the column control signal in response to the second signal PWA_CSL. The ninth flip-flop F37 may latch the first bit PWA_CSL1 of the column control signal to generate a second bit PWA_CSL2 of the column control signal in response to the second signal PWA_CSL. The tenth flip-flop F38 may latch the second bit PWA_CSL2 of the column control signal to generate a third bit PWA_CSL3 of the column control signal in response to the second signal. The eleventh flip-flop F39 may latch the third bit PWA_CSL3 of the column control signal to generate a fourth bit PWA_CSL4 of the column control signal in response to the second signal. The twelfth flip-flop F40 may latch the fourth bit PWA_CSL4 of the column control signal to generate a fifth bit PWA_CSL5 of the column control signal in response to the second signal. An output terminal of the twelfth flip-flop F40 may be electrically coupled to the input terminal of the eighth flip-flop F36.

Figure 17:
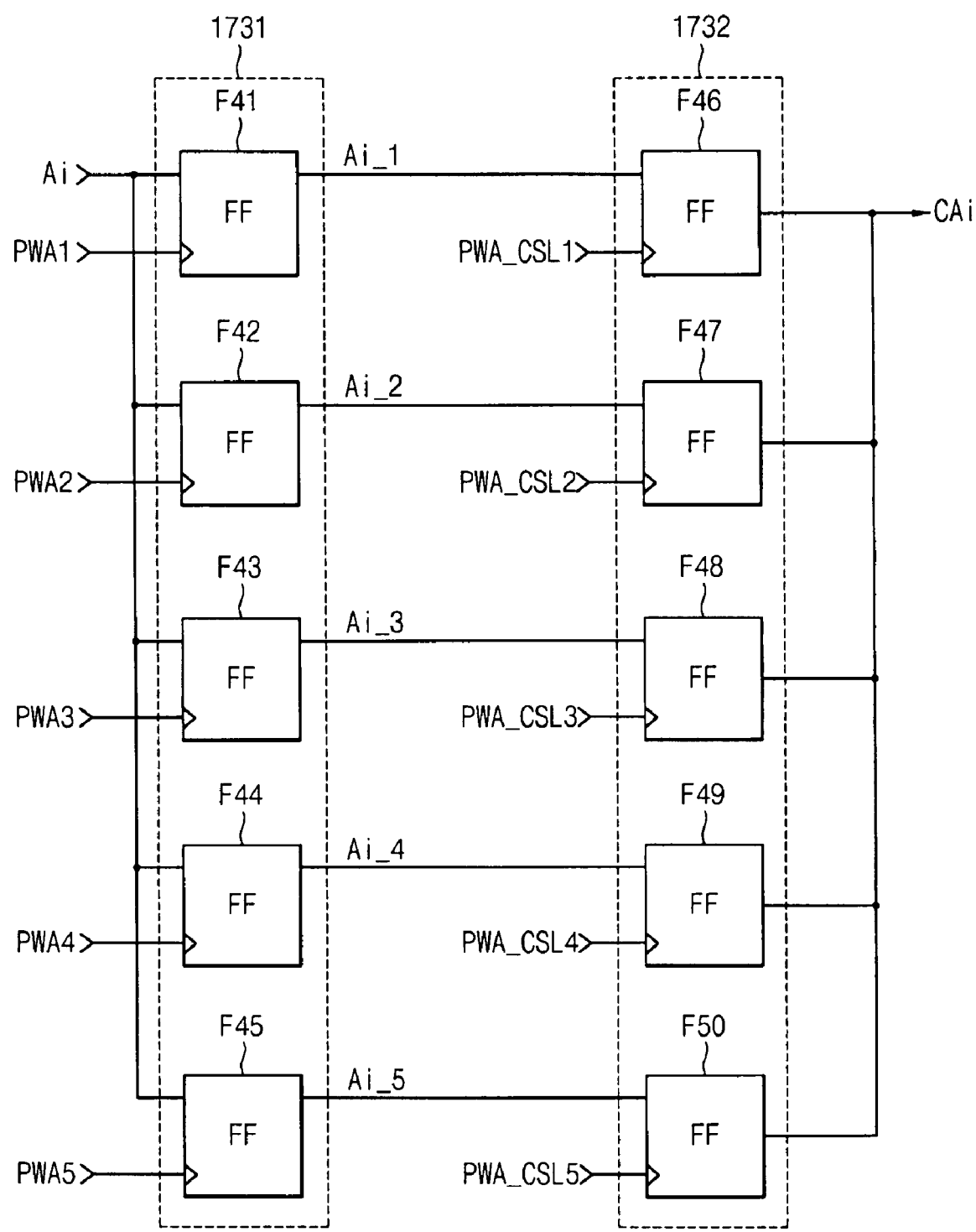
FIG. 17 is a circuit diagram illustrating a column slave circuit configured to generate a column address in the input latency control circuit of FIG. 12 according to another example embodiment of the present invention.

FIG. 17 is a circuit diagram illustrating one of the column slave circuits 1730 configured to generate a column address in the input latency control circuit 1700 of FIG. 12 according to another example embodiment of the present invention. In the example embodiment of FIG. 17, the first column slave circuit 1730 may include a first gating circuit 1731 and a second gating circuit 1732.

In the example embodiment of FIG. 17, the first gating circuit 1731 may latch a bit Ai of the first address signal to generate a first gating signal Ai_1, Ai_2, Ai_3, Ai_4, and Ai_5 in response to the write address control signal PWA1, PWA2, PWA3, PWA4, and PWA5. The second gating circuit 1732 may latch the first gating signal Ai_1, Ai_2, Ai_3, Ai_4, and Ai_5 to generate a bit CAi of the column address signal in response to the column control signal PWA_CSL1, PWA_CSL2, PWA_CSL3, PWA_CSL4, and PWA_CSL5. In the example embodiment of FIG. 17, the first gating circuit 1731 may include a first flip-flop F41, a second flip-flop F42, and a third flip-flop F43, a fourth flip-flop F44, and a fifth flip-flop F45.

In the example embodiment of FIG. 17, the first flip-flop F41 may latch the bit Ai of the first address signal to generate the first bit Ai_1 of the first gating signal in response to the first bit PWA1 of the write address control signal. The second flip-flop F42 may latch the bit Ai of the first address signal to generate a second bit Ai_2 of the first gating signal in response to a second bit PWA_2 of the write address control signal. The third flip-flop F43 may latch the bit Ai of the first address signal to generate a third bit Ai_3 of the first gating signal in response to a third bit PWA3 of the write address control signal. The fourth flip-flop F44 may latch the bit Ai of the first address signal to generate a fourth bit Ai_4 of the first gating signal in response to a fourth bit PWA4 of the write address control signal. The fifth flip-flop F45 may latch the bit Ai of the first address signal to generate a fifth bit Ai_5 of the first gating signal in response to a fifth bit PWA5 of the write address control signal.

In the example embodiment of FIG. 17, the second gating circuit 1732 may include a sixth flip-flop F46, a seventh flip-flop F47, and an eighth flip-flop F48, a ninth flip-flop F49, a tenth flip-flop F50. The sixth flip-flop F46 may latch the first bit Ai_1 of the first gating signal to generate the bit CAi of the column address signal in response to a first bit PWA_CSL1 of the column control signal. The seventh flip-flop F47 may latch the second bit Ai_2 of the first gating signal to generate the bit CAi of the column address signal in response to a second bit PWA_CSL2 of the column control signal. The eighth flip-flop F48 may latch the third bit Ai_3 of the first gating signal to generate the bit CAi of the column address signal in response to a third bit PWA_CSL3 of the column control signal. The ninth flip-flop F49 may latch the fourth bit Ai_4 of the first gating signal to generate the bit CAi of the column address signal in response to a fourth bit PWA_CSL4 of the column control signal. The tenth flip-flop F50 may latch the fifth bit Ai_5 of the first gating signal to generate the bit CAi of the column address signal in response to a fifth bit PWA_CSL5 of the column control signal. Output terminals of the flip-flops F46, F47, F48, F49, and F50 may be electrically coupled to each other.

Figure 18:
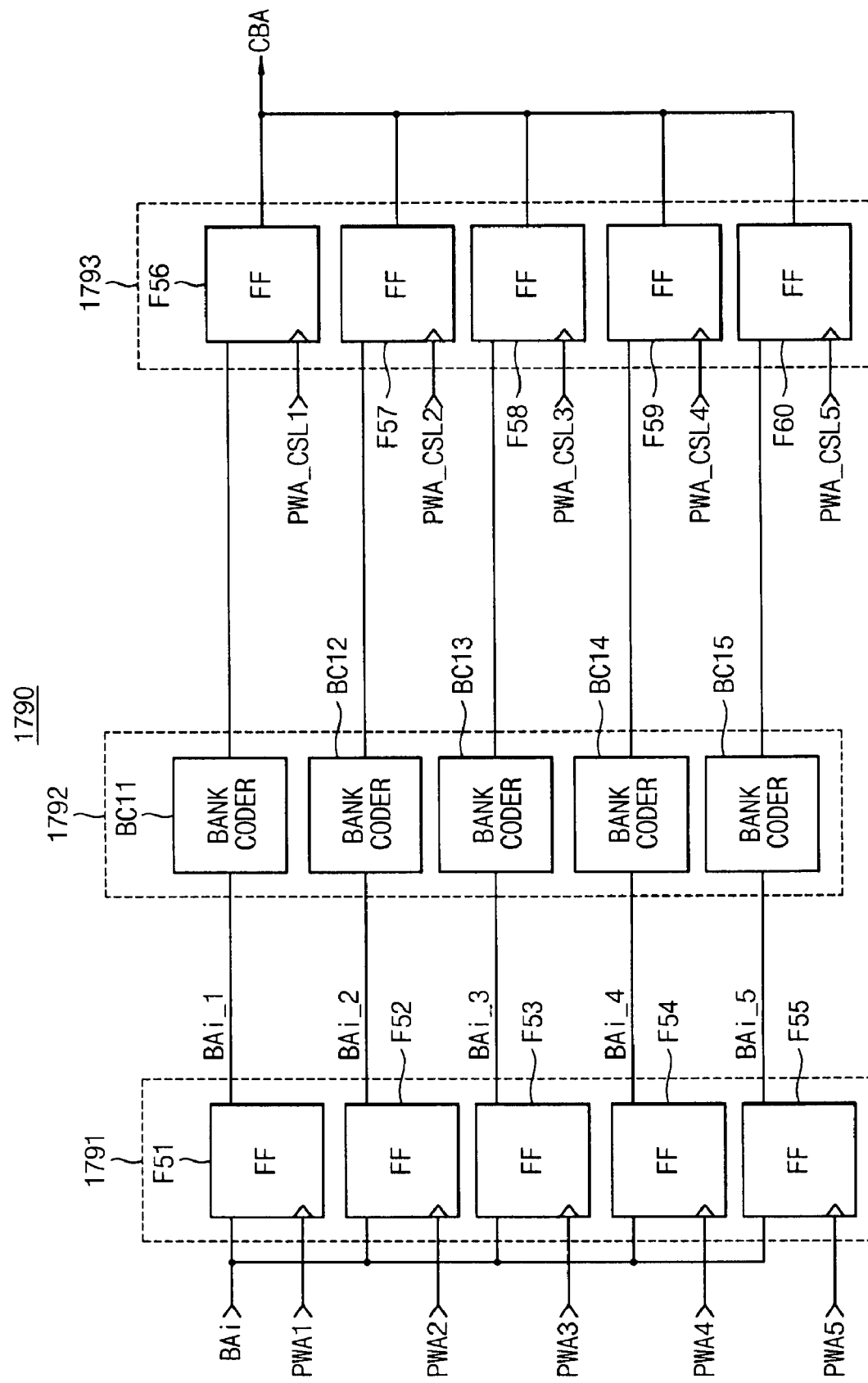
FIG. 18 is a circuit diagram illustrating a bank slave circuit configured to generate bank addresses in the input latency control circuit of FIG. 12 according to another example embodiment of the present invention.

FIG. 18 is a circuit diagram illustrating the bank slave circuit 1790 configured to generate bank addresses in the input latency control circuit 1700 of FIG. 12 according to another example embodiment of the present invention. In the example embodiment of FIG. 18, the bank slave circuit 1790 may include a first gating circuit 1791, a bank coding circuit 1792, and a second gating circuit 1793.

In the example embodiment of FIG. 18, the first gating circuit 1791 may latch a bit BAi of the second address signal to generate a first gating signal BAi_1, BAi_2, BAi_3, BAi_4, and BAi_5 in response to the write address control signal PWA1, PWA2, PWA3, PWA4, and PWA5. The bank coding circuit 1792 may perform bank coding on the first gating signal BAi_1, BAi_2, BAi_3, BAi_4, and BAi_5 to generate a coding signal. The second gating circuit 1793 may latch the coding signal to generate a bit CBA of the bank address signal in response to the column control signal PWA_CSL1, PWA_CSL2, PWA_CSL3, PWA_CSL4, and PWA_CSL5.

In the example embodiment of FIG. 18, the first gating circuit 1791 may include a first flip-flop F51, a second flip-flop F52, a third flip-flop F53, a fourth flip-flop F54, and a fifth flip-flop F55. The first flip-flop F51 may latch a bit BAi of the second address signal to generate a first bit BAi_1 of the first gating signal in response to a first bit PWA1 of the write address control signal. The second flip-flop F52 may latch a bit BAi of the second address signal to generate a second bit BAi_2 of the first gating signal in response to a second bit PWA2 of the write address control signal. The third flip-flop F53 may latch a bit BAi of the second address signal to generate a third bit BAi_3 of the first gating signal in response to a third bit PWA3 of the write address control signal. The fourth flip-flop F54 may latch a bit BAi of the second address signal to generate a fourth bit BAi_4 of the first gating signal in response to a fourth bit PWA4 of the write address control signal. The fifth flip-flop F55 may latch a bit BAi of the second address signal to generate a fifth bit BAi_5 of the first gating signal in response to a fifth bit PWA5 of the write address control signal.

In the example embodiment of FIG. 18, the bank coding circuit 1792 may include a first bank coder BC11, a second bank coder BC12, and a third bank coder BC13, a fourth bank coder BC14, and a fifth bank coder BC15. The first bank coder BC11 may perform the bank coding on the first bit BAi_1 of the first gating signal to generate a first bit of the coding signal. The second bank coder BC12 may perform the bank coding on the second bit BAi_2 of the first gating signal to generate a second bit of the coding signal. The third bank coder BC13 may perform the bank coding on the third bit BAi_3 of the first gating signal to generate a third bit of the coding signal.

In the example embodiment of FIG. 18, the second gating circuit 1793 may include a sixth flip-flop F56, a seventh flip-flop F57, an eighth flip-flop F58, a ninth flip-flop F59, and a tenth flip-flop F60. The sixth flip-flop F56 may latch the first bit of the coding signal to generate the bit CBA of the bank address signal in response to a first bit PWA_CSL1 of the column control signal. The seventh flip-flop F57 may latch the second bit of the coding signal to generate the bit CBA of the bank address signal in response to a second bit PWA_CSL2 of the column control signal. The eighth flip-flop F58 may latch the third bit of the coding signal to generate the bit CBA of the bank address signal in response to a third bit PWA_CSL3 of the column control signal. The ninth flip-flop F59 may latch the fourth bit of the coding signal to generate the bit CBA of the bank address signal in response to a fourth bit PWA_CSL4 of the column control signal. Output terminals of the flip-flops F56, F57, F58, F59, and F60 may be electrically coupled to each other.

In another example embodiment of the present invention, the input latency control circuit 1700 of FIGS. 12 to 18 may operate similarly to the input latency control circuit 1600 of FIGS. 3 to 10. In the input latency control circuit 1700 of FIG. 12, a maximum value of the input latency may be seven and the burst length may be four.

Figure 19:
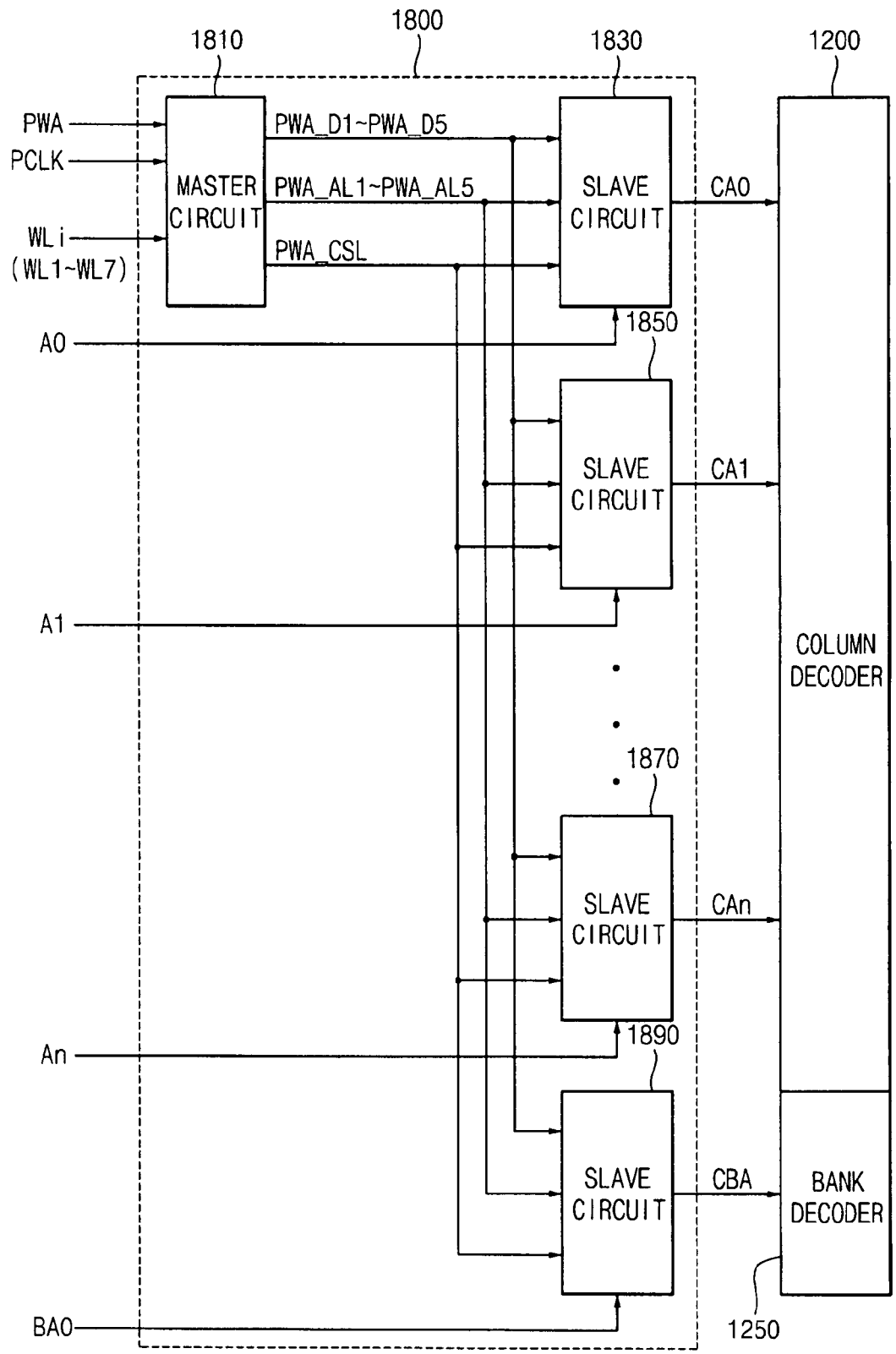
FIG. 19 is a block diagram an input latency control circuit in the semiconductor memory device of FIG. 2 according to another example embodiment of the present invention.

FIG. 19 is a block diagram an input latency control circuit 1800 in the semiconductor memory device of FIG. 2 according to another example embodiment of the present invention. In the input latency control circuit 1800 of FIG. 19, in an example, a maximum value of the input latency may be seven and the burst length may be four.

In the example embodiment of FIG. 19, the input latency control circuit 1800 may include a master circuit 1810, a first column slave circuit 1830, a second column slave circuit

1850, an (n+1)th column slave circuit 1870, and a bank slave circuit 1890. The input latency control circuit 1800 may control a time point of generating a column address signal CA having (n+1) bits <0:n> and the bank address signal CBA according to the write latency signal WL1 to WL7. For example, the input latency control circuit 1800 may control a time point of activating the column address signal CA and the bank address signal CBA by delaying address signals A0 to An and BA0 by a delay time corresponding to the write latency signal WLi.

In the example embodiment of FIG. 19, the master circuit 1810 may generate a first write address control signal having five bits PWA_D1, PWA_D2, PWA_D3, PWA_D4, and PWA_D5, a second write address control signal having five bits PWA_AL1, PWA_AL2, PWA_AL3, PWA_AL4, and PWA_AL5, and a column control signal PWA_CSL, based on the internal clock signal PCLK, the write command signal PWA, and the write latency signal having seven bits WL1 to WL7.

In the example embodiment of FIG. 19, the first column slave circuit 1830 may perform gating on a first bit A0 of the internal address signal ADD in the pipeline mode to generate a first bit CA0 of the column address signal in response to the first write address control signal having five bits PWA_D1, PWA_D2, PWA_D3, PWA_D4, and PWA_D5, the second write address control signal having five bits PWA_AL1, PWA_AL2, PWA_AL3, PWA_AL4, and PWA_AL5, and the column control signal PWA_CSL. The second column slave circuit 1850 may perform gating on a second bit A1 of the internal address signal ADD in the pipeline mode to generate a second bit CA1 of the column address signal in response to the first write address control signal having five bits PWA_D1, PWA_D2, PWA_D3, PWA_D4, and PWA_D5, the second write address control signal having five bits PWA_AL1, PWA_AL2, PWA_AL3, PWA_AL4, and PWA_AL5, and the column control signal PWA_CSL. The (n+1)th column slave circuit 1870 may perform gating on an (n+1)th bit An of the internal address signal ADD in the pipeline mode to generate an (n+1)th bit CAn of the column address signal in response to the first write address control signal having five bits PWA_D1, PWA_D2, PWA_D3, PWA_D4, and PWA_D5, the second write address control signal having five bits PWA_AL1, PWA_AL2, PWA_AL3, PWA_AL4, and PWA_AL5, and the column control signal PWA_CSL.

In the example embodiment of FIG. 19, the bank slave circuit 1890 may perform gating on a bit BA0 of the internal address signal ADD in the pipeline mode to generate a bit CBA of the bank address signal in response to the first write address control signal having five bits PWA_D1, PWA_D2, PWA_D3, PWA_D4, and PWA_D5, the second write address control signal having five bits PWA_AL1, PWA_AL2, PWA_AL3, PWA_AL4, and PWA_AL5, and the column control signal PWA_CSL. In an example, the bit BA0 of the internal address signal ADD may be a bit used for bank selection. The column control signal CA0 to CAn may be provided to the column decoder 1200, and the bank address signal CBA may be provided to the bank decoder 1250.

In the example embodiment of FIG. 19, only one bank slave circuit 1890 for generating the bank address signal CBA is illustrated. However, it is understood that the bank address signal may include any number of bits, and any number of circuits for generating the bank address signal any number of bits may be included in the input latency control circuit 1800.

Figure 20:
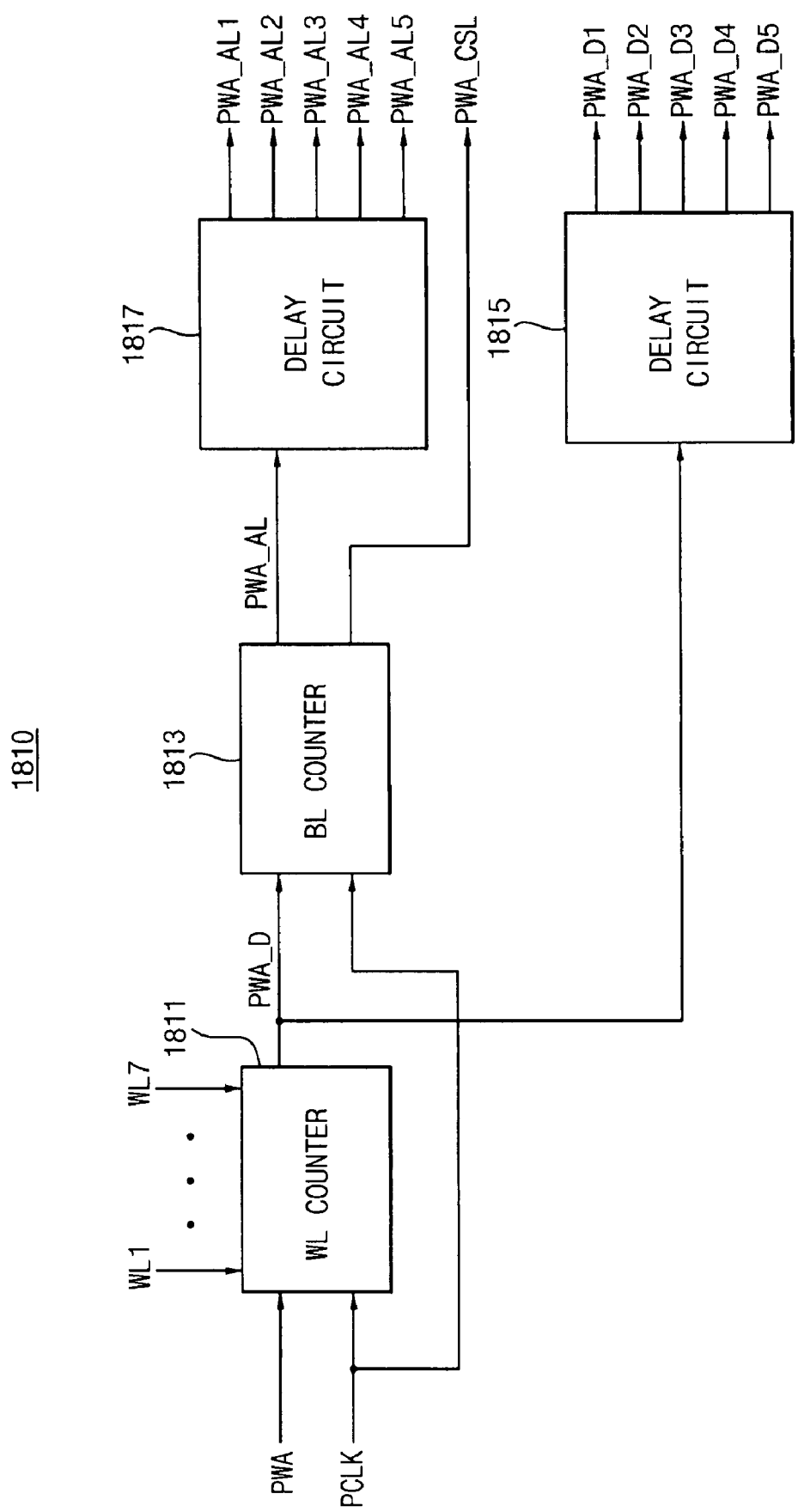
FIG. 20 is a block diagram illustrating a master circuit in the input latency control circuit of FIG. 19 according to another example embodiment of the present invention.

FIG. 20 is a block diagram illustrating the master circuit 1810 in the input latency control circuit 1800 of FIG. 19 according to another example embodiment of the present invention. In the example embodiment of FIG. 20, the master circuit 1810 may include a write latency counter 1811, a burst length counter 1813, a first delay circuit 1815, and a second delay circuit 1817.

In the example embodiment of FIG. 20, the write latency counter 1811 may delay the write command signal PWA to generate a first signal PWA_D in response to the internal clock signal PCLK and the write latency signal WL1 to WL7. The burst length counter 1813 may delay the first signal PWA_D by a burst length (BL) to generate a column control signal PWA_CSL and a second signal PWA_AL in response to the internal clock signal PCLK. The first delay circuit 1815 may generate the first write address control signal having five bits PWA_D1, PWA_D2, PWA_D3, PWA_D4, and PWA_D5 in response to the first signal PWA_D. The neighboring bits of the five bits PWA_D1, PWA_D2, PWA_D3, PWA_D4, and PWA_D5 may have a phase difference corresponding to a period of the first signal PWA_D. The second delay circuit 1817 may generate the second write address control signal having five bits PWA_AL1, PWA_AL2, PWA_AL3, PWA_AL4, and PWA_AL5 in response to the second signal PWA_AL. The neighboring bits of the five bits PWA_AL1, PWA_AL2, PWA_AL3, PWA_AL4, and PWA_AL5 may have a phase difference corresponding to a period of the second signal PWA_AL.

In the example embodiment of FIG. 20, the write latency counter 1811 may have the same structure as the write latency counter 1611 shown in FIG. 5, and as such a further description thereof has been omitted for the sake of brevity.

Figure 21:
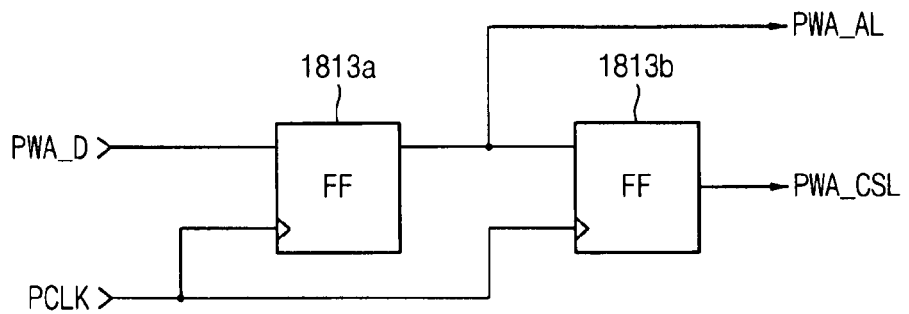
FIG. 21 is a circuit diagram illustrating a burst length counter in the master circuit of FIG. 20 according to another example embodiment of the present invention.

FIG. 21 is a circuit diagram illustrating the burst length counter 1813 in the master circuit 1810 of FIG. 20 according to another example embodiment of the present invention. In the example embodiment of FIG. 21, the burst length counter 1813 may include a first flip-flop 1813a and a second flip-flop 1813b.

In the example embodiment of FIG. 21, the first flip-flop 1813a may latch the first signal PWA_D to generate the second signal PWA_AL in response to the internal clock signal PCLK. The second flip-flop 1813b may latch the second signal PWA_AL to generate the column control signal PWA_CSL in response to the internal clock signal PCLK.

Figure 22:
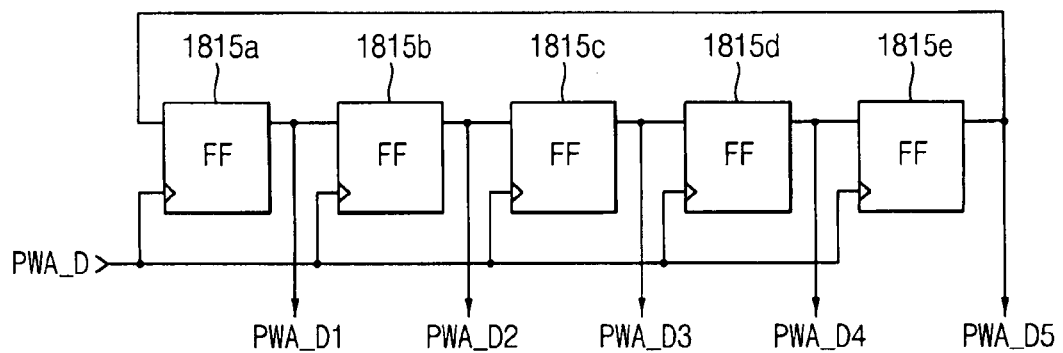
FIG. 22 is a circuit diagram illustrating a first delay circuit in the master circuit of FIG. 20 according to another example embodiment of the present invention.

FIG. 22 is a circuit diagram illustrating the first delay circuit 1815 in the master circuit 1810 of FIG. 20 according to another example embodiment of the present invention. In the example embodiment of FIG. 22, the first delay circuit 1815 may include a third flip-flop 1815a, a fourth flip-flop 1815b, a fifth flip-flop 1815c, a sixth flip-flop 1815d, and a seventh flip-flop 1815e.

In the example embodiment of FIG. 22, the third flip-flop 1815a may latch a signal of an input terminal to generate a first bit PWA_D1 of the first write address control signal in response to the first signal PWA_D. The fourth flip-flop 1815b may latch the first bit PWA_D1 of the first write address control signal to generate a second bit PWA_D2 of the first write address control signal in response to the first signal PWA_D. The fifth flip-flop 1815c may latch the second bit PWA_D2 of the first write address control signal to generate a third bit PWA_D3 of the first write address control signal in response to the first signal PWA_D. The sixth flip-flop 1815d may latch the third bit PWA_D3 of the first write address control signal to generate a fourth bit PWA_D4 of the first write address control signal in response to the first signal PWA_D. The seventh flip-flop 1815e may latch the fourth bit PWA_D4 of the first write address control signal to generate a fifth bit PWA_D5 of the first write address control signal in response to the first signal PWA_D. An output terminal of the seventh flip-flop 1815e may be electrically coupled to the input terminal of the third flip-flop 1815a.

Figure 23:
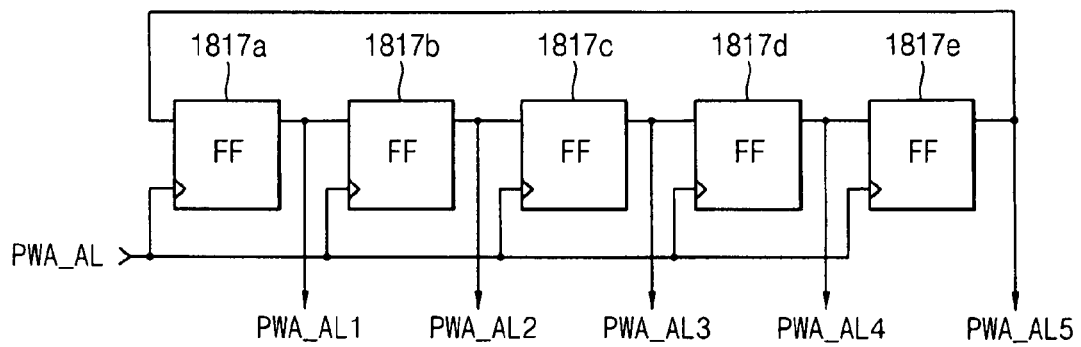
FIG. 23 is a circuit diagram illustrating a second delay circuit in the master circuit of FIG. 20 according to another example embodiment of the present invention.

FIG. 23 is a circuit diagram illustrating the second delay circuit 1817 in the master circuit 1810 of FIG. 20 according to another example embodiment of the present invention. In the example embodiment of FIG. 23, the second delay circuit 1817 may include an eighth flip-flop 1817a, a ninth flip-flop 1817b, a tenth flip-flop 1817c, an eleventh flip-flop 1817d, and a twelfth flip-flop 1817e.

In the example embodiment of FIG. 23, the eighth flip-flop 1817a may latch a signal of an input terminal to generate a first bit PWA_AL1 of the second write address control signal in response to the second signal PWA_AL. The ninth flip-flop 1817b may latch the first bit PWA_AL1 of the second write address control signal to generate a second bit PWA_AL2 of the second write address control signal in response to the second signal PWA_AL. The tenth flip-flop 1817c may latch the second bit PWA_AL2 of the second write address control signal to generate a third bit PWA_AL3 of the second write address control signal in response to the second signal PWA_AL. The eleventh flip-flop 1817d may latch the third bit PWA_AL3 of the second write address control signal to generate a fourth bit PWA_AL4 of the second write address control signal in response to the second signal PWA_AL. The twelfth flip-flop 1817e may latch the fourth bit PWA_AL4 of the second write address control signal to generate a fifth bit PWA_AL5 of the second write address control signal in response to the second signal PWA_AL. An output terminal of the twelfth flip-flop 1817e may be electrically coupled to the input terminal of the eighth flip-flop 1817a.

Figure 24:
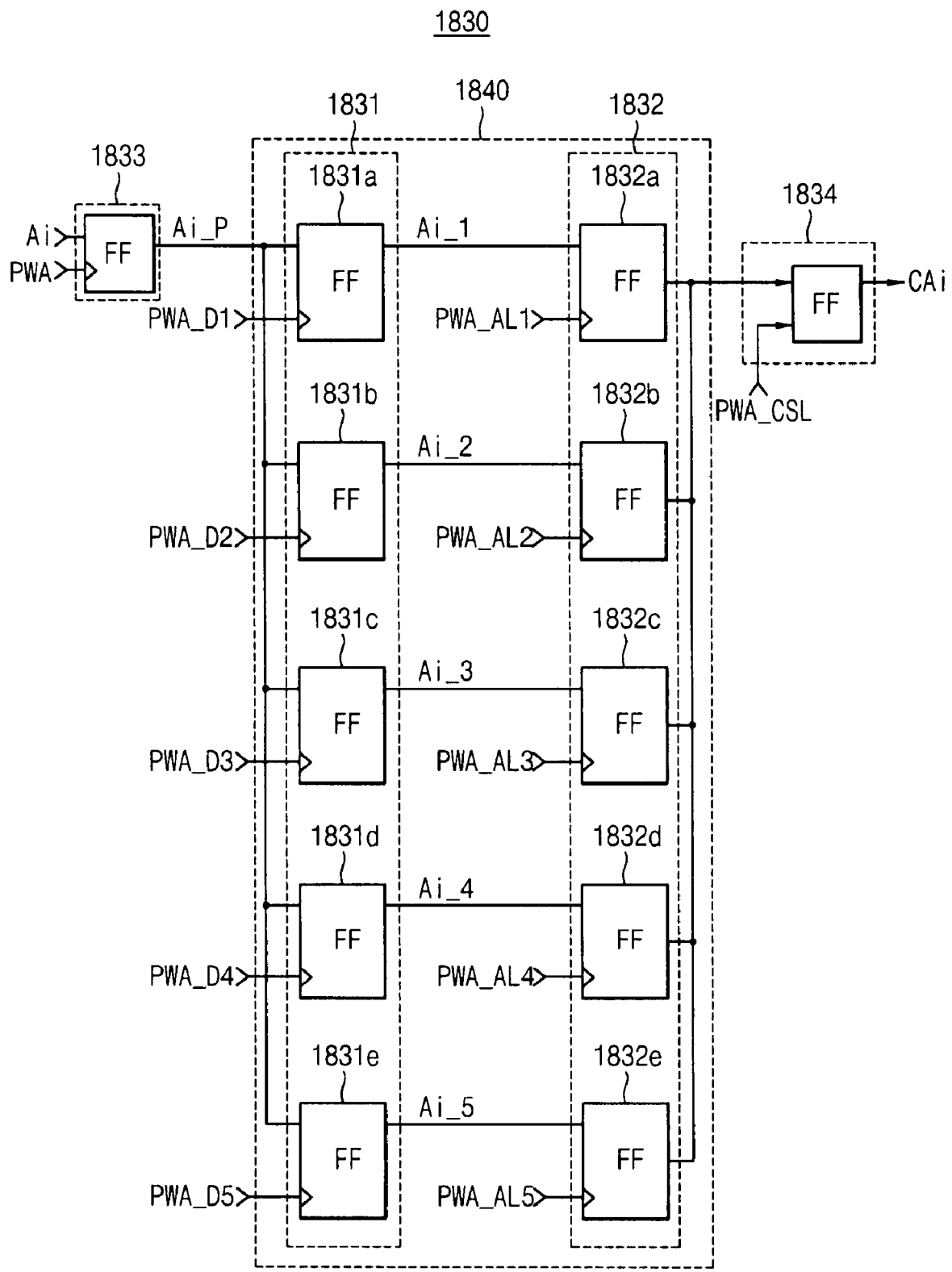
FIG. 24 is a circuit diagram illustrating a column slave circuit configured to generate a column address in the input latency control circuit of FIG. 19 according to another example embodiment of the present invention.

FIG. 24 is a circuit diagram illustrating one of the column slave circuits 1830 configured to generate a column address in the input latency control circuit 1800 of FIG. 19 according to another example embodiment of the present invention. In the example embodiment of FIG. 24, the first column slave circuit 1830 may include an input stage 1833, a first gating circuit 1831, a second gating circuit 1832, and an output stage 1834. The first gating circuit 1831 and the second gating circuit 1832 may collectively constitute a gating circuit 1840.

In the example embodiment of FIG. 24, the input stage 1833 may latch a bit Ai of the first address signal to generate a bit of a latched address signal Ai_P in response to the write command signal PWA. The first gating circuit 1831 may latch the bit of the latched address signal Ai_P to generate a first gating signal Ai_1, Ai_2, Ai_3, Ai_4, and Ai_5 in response to the first write address control signal PWA_D1, PWA_D2, PWA_D3, PWA_D4, and PWA_D5. The second gating circuit 1832 may latch the first gating signal Ai_1, Ai_2, Ai_3, Ai_4, and Ai_5 to generate a second gating signal in response to the second write address control signal having five bits PWA_AL1, PWA_AL2, PWA_AL3, PWA_AL4, and PWA_AL5. The output stage 1834 may latch the second gating signal to generate a bit CAi of the column address signal in response to the column control signal PWA_CSL. In an example, each of the input stage 1833 and the output stage 1834 may be embodied as a flip-flop.

In the example embodiment of FIG. 24, the first gating circuit 1831 may include a first flip-flop 1831a, a second flip-flop 1831b, and a third flip-flop 1831c, a fourth flip-flop 1831d, and a fifth flip-flop 1831e. The first flip-flop 1831a may latch the bit of the latched address signal Ai_P to generate the first bit Ai_1 of the first gating signal in response to the first bit PWA_D1 of the first write address control signal. The second flip-flop 1831b may latch the bit of the latched address signal Ai_P to generate the second bit Ai_2 of the first gating signal in response to the second bit PWA_D2 of the first write address control signal. The third flip-flop 1831c may latch the bit of the latched address signal Ai_P to generate the third bit Ai_3 of the first gating signal in response to the third bit PWA_D3 of the first write address control signal. The fourth flip-flop 1831d may latch the bit of the latched address signal Ai_P to generate the fourth bit Ai_4 of the first gating signal in response to the fourth bit PWA_D4 of the first write address control signal. The fifth flip-flop 1831e may latch the bit of the latched address signal Ai_P to generate the fifth bit Ai_5 of the first gating signal in response to the fifth bit PWA_D5 of the first write address control signal.

In the example embodiment of FIG. 24, the second gating circuit 1732 may include a sixth flip-flop 1832a, a seventh flip-flop 1832b, an eighth flip-flop 1832c, a ninth flip-flop 1832d, a tenth flip-flop 1832e. The sixth flip-flop 1832a may latch the first bit Ai_1 of the first gating signal to generate the second gating signal in response to a first bit PWA_AL1 of the second write address control signal. The seventh flip-flop 1832b may latch the second bit Ai_2 of the first gating signal to generate the second gating signal in response to a second bit PWA_AL2 of the second write address control signal. The eighth flip-flop 1832c may latch the third bit Ai_3 of the first gating signal to generate the second gating signal in response to a third bit PWA_AL3 of the second write address control signal. The ninth flip-flop 1832d may latch the fourth bit Ai_4 of the first gating signal to generate the second gating signal in response to a fourth bit PWA_AL4 of the second write address control signal. Output terminals of the flip-flops 1832a, 1832b, 1832c, 1832d, and 1832e may be electrically coupled to each other.

Figure 25:
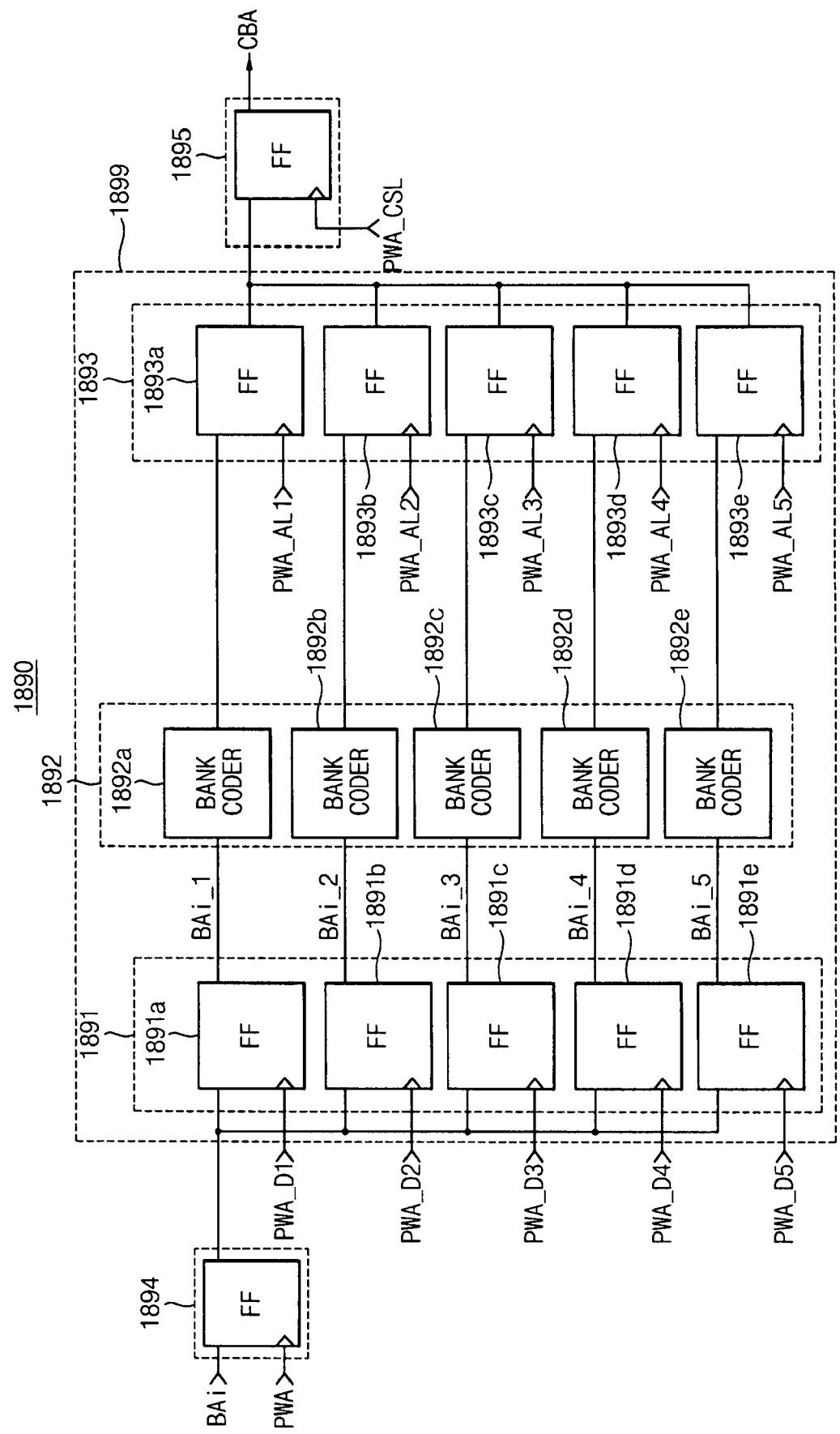
FIG. 25 is a circuit diagram illustrating a bank slave circuit configured to generate bank addresses in the input latency control circuit of FIG. 19 according to another example embodiment of the present invention.

FIG. 25 is a circuit diagram illustrating the bank slave circuit 1890 configured to generate bank addresses in the input latency control circuit 1800 of FIG. 19 according to another example embodiment of the present invention. In the example embodiment of FIG. 25, the bank slave circuit 1890 may include an input stage 1894, a first gating circuit 1891, a bank coding circuit 1892, a second gating circuit 1893, and an output stage 1895.

In the example embodiment of FIG. 25, the input stage 1894 may latch a bit BAi of the second address signal to generate a bit of a latched address signal in response to the write command signal PWA. The first gating circuit 1891 may latch the latched address signal to generate a first gating signal having five bits BAi_1, BAi_2, BAi_3, BAi_4, and BAi_5 in response to the first write address control signal having five bits PWA_D1, PWA_D2, PWA_D3, PWA_D4, and PWA_D5. The bank coding circuit 1892 may perform bank coding on the first gating signal BAi_1, BAi_2, BAi_3, BAi_4, and BAi_5 to generate a coding signal. The second gating circuit 1893 may latch the coding signal to generate a second gating signal in response to the second write address control signal having five bits PWA_AL1, PWA_AL2, PWA_AL3, PWA_AL4, and PWA_AL5. The output stage 1895 may latch the second gating signal to generate a bit CBA of the bank address signal in response to the column control signal PWA_CSL. In an example, each of the input stage 1894 and the output stage 1895 may be embodied as a flip-flop.

In the example embodiment of FIG. 25, the first gating circuit 1891 may include a first flip-flop 1891a, a second flip-flop 1891b, a third flip-flop 1891c, a fourth flip-flop 1891d, and a fifth flip-flop 1891e. The first flip-flop 1891a may latch the bit of the latched address signal to generate a first bit BAi_1 of the first gating signal in response to a first bit PWA_D1 of the first write address control signal. The second flip-flop 1891b may latch the bit of the latched address signal to generate a second bit BAi_2 of the first gating signal in response to a second bit PWA_D2 of the first write address control signal. The third flip-flop 1891c may latch the bit of the latched address signal to generate a third bit BAi_3 of the first gating signal in response to a third bit PWA_D3 of the first write address control signal. The fourth flip-flop 1891*d* may latch the bit of the latched address signal to generate a fourth bit BAi_4 of the first gating signal in response to a fourth bit PWA_D4 of the first write address control signal.

In the example embodiment of FIG. 25, the bank coding circuit 1892 may include a first bank coder 1892*a*, a second bank coder 1892*b*, and a third bank coder 1892*c*, a fourth bank coder 1892*d*, and a fifth bank coder 1892*e*. The first bank coder 1892*a* may perform the bank coding on the first bit BAi_1 of the first gating signal to generate a first bit of the coding signal. The second bank coder 1892*b* may perform the bank coding on the second bit BAi_2 of the first gating signal to generate a second bit of the coding signal. The third bank coder 1892*c* may perform the bank coding on the third bit BAi_3 of the first gating signal to generate a third bit of the coding signal. The fourth bank coder 1892*d* may perform the bank coding on the fourth bit BAi_4 of the first gating signal to generate a fourth bit of the coding signal. The fifth bank coder 1892*e* may perform the bank coding on the fifth bit BAi_5 of the first gating signal to generate a fifth bit of the coding signal.

In the example embodiment of FIG. 25, the second gating circuit 1893 may include a sixth flip-flop 1893*a*, a seventh flip-flop 1893*b*, an eighth flip-flop 1893*c*, a ninth flip-flop 1893*d*, a tenth flip-flop 1893*e*. The sixth flip-flop 1893*a* may latch the first bit of the coding signal to generate the second gating signal in response to a first bit PWA_AL1 of the second write address control signal. The seventh flip-flop 1893*b* may latch the second bit of the coding signal to generate the second gating signal in response to a second bit PWA_AL2 of the second write address control signal. The eighth flip-flop 1893*c* may latch the third bit of the coding signal to generate the second gating signal in response to a third bit PWA_AL3 of the second write address control signal. The ninth flip-flop 1893*d* may latch the fourth bit of the coding signal to generate the second gating signal in response to a fourth bit PWA_AL4 of the second write address control signal. The tenth flip-flop 1893*e* may latch the fifth bit of the coding signal to generate the second gating signal in response to a fifth bit PWA_AL5 of the second write address control signal. Output terminals of the flip-flops 1893*a*, 1893*b*, 1893*c*, 1893*d*, and 1893*e* may be electrically coupled to each other.

Figure 26:
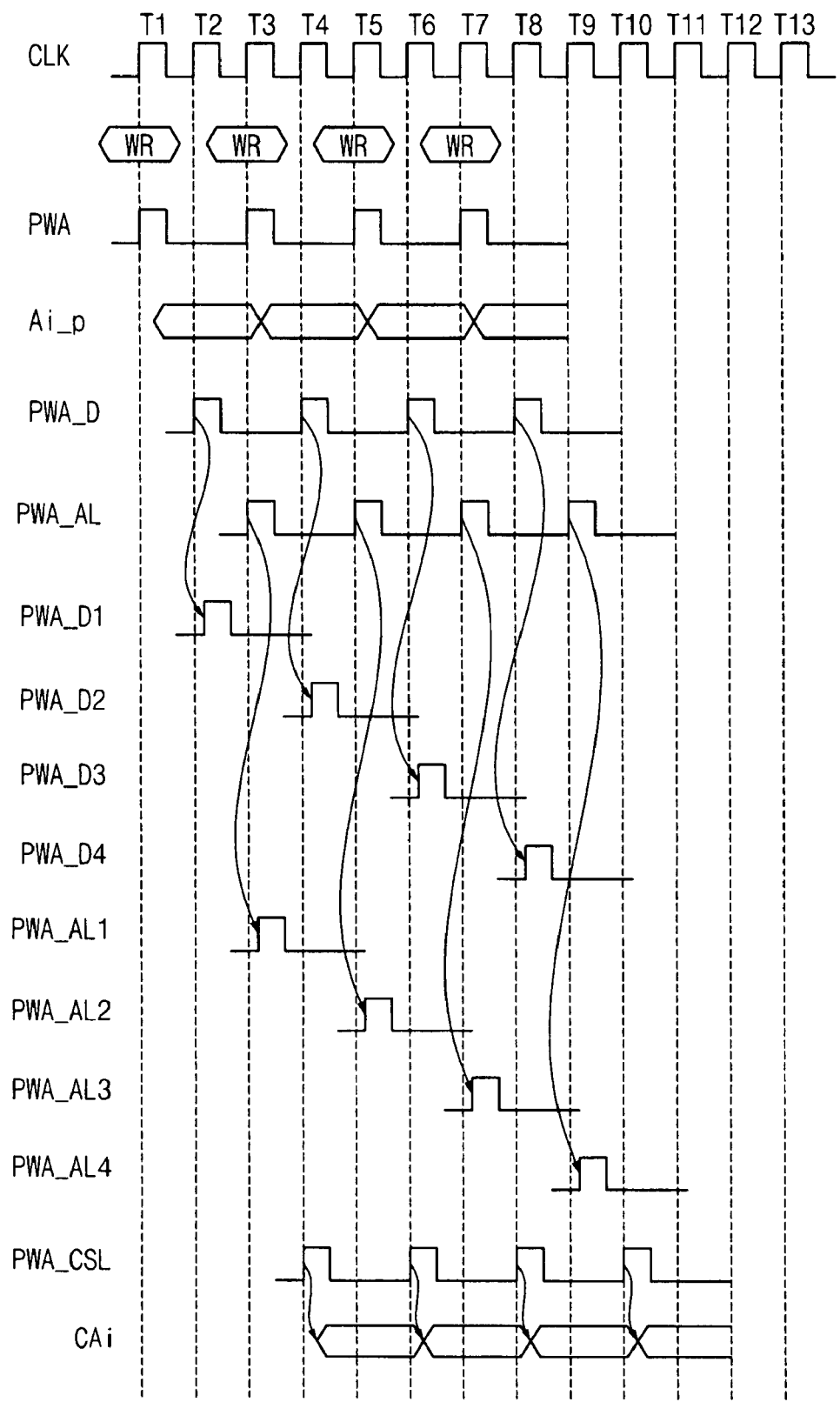
FIG. 26 is a timing diagram illustrating an operation of the input latency control circuit of FIG. 19 according to another example embodiment of the present invention.

FIG. 26 is a timing diagram illustrating an operation of the input latency control circuit 1800 of FIG. 19 according to another example embodiment of the present invention. In an example, in FIG. 26, the write latency may be assumed to be seven. In another example, the clock signal CLK illustrated in FIG. 26 may correspond to the internal clock signal PCLK shown in FIG. 20.

In the example embodiment of FIG. 26, the write command WR may be generated every two clock cycles. The first signal PWA_D may be a delayed version of the write command signal PWA (e.g., delayed by the write latency counter 1811 in FIG. 20). The first write address control signal having the bits PWA_D1, PWA_D2, PWA_D3, PWA_D4, and PWA_D5 may be generated in response to the first signal PWA_D. The neighboring bits of five bits PWA_D1, PWA_D2, PWA_D3, PWA_D4, and PWA_D5 may have a phase difference corresponding to a period of the first signal PWA_D.

In the example embodiment of FIG. 26, PWA_D5 is not illustrated for convenience of description. The column control signal PWA_CSL may be a signal being a delayed version of the first signal PWA_D (e.g., delayed by a burst length (BL) by the burst length counter 1813 in FIG. 20). The second signal PWA_AL may be a signal being a delayed version of the first signal PWA_D (e.g., delayed by a half of the burst length by the burst length counter 1813 in FIG. 20). The second write address control signal having the bits PWA_AL1, PWA_AL2, PWA_AL3, PWA_AL4, and PWA_AL5 may be generated in response to the second signal PWA_AL. The neighboring bits of five bits PWA_AL1, PWA_AL2, PWA_AL3, PWA_AL4, and PWA_AL5 may have a phase difference corresponding to a period of the second signal PWA_AL.

In the example embodiment of FIG. 26, PWA_AL5 is not illustrated for convenience of description. The output signal Ai_P of the input stage 1833 included in the first column slave circuit 1830 may be generated in response to the write command signal PWA. The bit CAi of the column address signal may be generated in response to the column control signal PWA_CSL.

Hereinafter, example operation of the input latency control circuit 1800 of the example embodiments of FIG. 19 to FIG. 26 will be described in greater detail.

In the example embodiment of FIG. 11, in a "worst" case, the margin between control signals PWA_CSL1, PWA_CSL2, and PWA_CSL3 and the effective address signals Ai_1, Ai_2, and Ai_3 may be three tCK. Here, tCK may denote a period of the clock signal CLK. In the conventional art, in contrast, a margin between the control signals and the effective address signals may be as low as equal to or less than one tCK. If the margin between the control signals and the effective address signals is above a threshold value, the timing control of the control signals PWA_CSL1, PWA_CSL2, and PWA_CSL3 may be easier to control, and the circuit design may be simplified and an associated power consumption may be reduced.

In example operation of the input latency control circuit 1800, referring to FIGS. 19 to 26, the input latency control circuit 1800 may perform gating in a pipelined mode and may generate a column address signal and a bank address signal. Therefore, a semiconductor memory device including the input latency control circuit 1800 may decrease a number of flip-flops required to control the latency of the semiconductor memory device, and may increase a margin between the input control signals and the effective address signals.

In example operation of the input latency control circuit 1800, referring to FIGS. 19 to 26, the input latency control circuit 1800 may include an input stage that operates in response to the write command signal PWA and an output stage that operates in response to the column control signal PWA_CSL (e.g., in contrast to the input latency control circuit 1700 of FIG. 12).

In example operation of the input latency control circuit 1800, referring to FIGS. 19 to 26, each of a bit Ai of an address signal and a bit BAi of a bank address signal may be input in response to only one control signal PWA. Further, each of a bit CAi of a column address signal and a bit CBA of a bank address signal may be output in response to only one control signal PWA_CSL.

In example operation of the input latency control circuit 1800, referring to FIGS. 19 to 26, a bit of an address signal and a bit of a bank address signal BAi may be input in serial and processed in parallel and output in serial because the slave circuits included in the input latency control circuit 1800 may include an input stage, a gating circuit, and an output stage. Therefore, the input latency control circuit 1800 may decrease instability of a setup time and a hold time of the address signals that may be caused by skews among control signals. Further, the input latency control circuit 1800 may decrease skews of column address signals and bank address signals.

In another example embodiment of the present invention, a semiconductor memory device including an input latency control circuit may gate address signals in a pipeline mode to generate a column address signal and a bank address signal. Therefore, the semiconductor memory device may decrease a number of flip-flops required to adequately control a latency of the semiconductor memory device, and may increase a margin between the input control signals and the effective address signals. Further, the semiconductor memory device may have a relatively low power consumption and may occupy a smaller area in a semiconductor integrated circuit. Further, the semiconductor memory device including the input latency control circuit according to the present invention may control a setup time and a hold time and may decrease skews of column address signals and bank address signals.

Example embodiments of the present invention being thus described, it will be obvious that the same may be varied in many ways. For example, while above-described example embodiments of the present invention are directed to input latency control circuits having a burst length of four or eight, it is understood that other example embodiments of the present invention may be directed to input latency control circuits having any burst length.

Such variations are not to be regarded as a departure from the spirit and scope of example embodiments of the present invention, and all such modifications as would be obvious to one skilled in the art are intended to be included within the scope of the following claims.

What is claimed is:

1. A semiconductor memory device, comprising:
 a clock buffer configured to generate an internal clock signal based on an external clock signal;
 a command decoder configured to decode an external command signal to generate a write command signal; and
 an input latency control circuit configured to generate a column control signal and at least one write address control signal based on the internal clock signal, the write command signal and a write latency signal and configured to gate an address signal in a pipeline mode to generate a column address signal and a bank address signal based on the column control signal and the at least one write address control signal, wherein the input latency control circuit includes:
  a master circuit configured to generate the column control signal and the at least one write address control signal based on the internal clock signal, the write command signal and the write latency signal;
  at least one column slave circuit configured to gate a first address signal in the pipeline mode to generate the column address signal in response to the column control signal and the at least one write address control signal; and
  at least one bank slave circuit configured to gate a second address signal in the pipeline mode to generate the bank address signal in response to the column control signal and the at least one write address control signal.

2. The semiconductor memory device of claim 1, wherein the master circuit includes:
 a write latency counter configured to delay the write command signal to generate a first signal in response to the internal clock signal and the write latency signal;
 a burst length counter configured to delay the first signal by a burst length to generate a second signal in response to the internal clock signal;
 a first delay circuit configured to generate the at least one write address control signal having a plurality of bits in response to the write command signal, neighboring bits of the at least one write address control signal having a phase difference corresponding to a period of the write command signal; and
 a second delay circuit configured to generate the column control signal having a plurality of bits in response to the second signal, neighboring bits of the column control signal having a phase difference corresponding to a period of the second signal.

3. The semiconductor memory device of claim 2, wherein the write latency counter sets a delay time of the write command signal based on an enable bit of the write latency signal.

4. The semiconductor memory device of claim 2, wherein the input latency control circuit has a write latency of seven and a burst length of eight.

5. The semiconductor memory device of claim 4, wherein the write latency counter is configured to have a plurality of unit circuits, each of the unit circuits including:
 a multiplexer configured to operate in response to the write latency signal; and
 a flip-flop configured to latch an output signal of the multiplexer in response to the internal clock signal.

6. The semiconductor memory device of claim 4, wherein the burst length counter includes:
 a first flip-flop configured to latch the first signal in response to the internal clock signal;
 a second flip-flop configured to latch an output signal of the first flip-flop in response to the internal clock signal;
 a third flip-flop configured to latch an output signal of the second flip-flop in response to the internal clock signal; and
 a fourth flip-flop configured to latch an output signal of the third flip-flop to output the second signal in response to the internal clock signal.

7. The semiconductor memory device of claim 4, wherein the first delay circuit includes:
 a first flip-flop configured to latch a signal of an input terminal to generate a first bit of the at least one write address control signal in response to the write command signal;
 a second flip-flop configured to latch the first bit of the at least one write address control signal to generate a second bit of the at least one write address control signal in response to the write command signal; and
 a third flip-flop configured to latch the second bit of the at least one write address control signal to generate a third bit of the at least one write address control signal in response to the write command signal, an output terminal of the third flip-flop being electrically coupled to the input terminal of the first flip-flop.

8. The semiconductor memory device of claim 4, wherein the second delay circuit comprises:
 a first flip-flop configured to latch a signal of an input terminal to generate a first bit of the column control signal in response to the second signal;
 a second flip-flop configured to latch the first bit of the column control signal to generate a second bit of the column control signal in response to the second signal; and
 a third flip-flop configured to latch the second bit of the column control signal to generate a third bit of the column control signal in response to the second signal, an output terminal of the third flip-flop being electrically coupled to the input terminal of the first flip-flop.

9. The semiconductor memory device of claim 4, wherein each of the column slave circuits includes:

a first gating circuit configured to latch a first bit of the first address signal to generate a first gating signal in response to the at least one write address control signal; and a second gating circuit configured to latch the first gating signal to generate a first bit of the column address signal in response to the column control signal.

10. The semiconductor memory device of claim 9, wherein the first gating circuit includes:

a first flip-flop configured to latch a first bit of the first address signal to generate a first bit of the first gating signal in response to a first bit of the at least one write address control signal;

a second flip-flop configured to latch the first bit of the first address signal to generate a second bit of the first gating signal in response to a second bit of the at least one write address control signal; and a third flip-flop configured to latch the first bit of the first address signal to generate a third bit of the first gating signal in response to a third bit of the at least one write address control signal.

11. The semiconductor memory device of claim 10, wherein the second gating circuit comprises:

a fourth flip-flop configured to latch the first bit of the first gating signal to generate the first bit of the column address signal in response to a first bit of the column control signal;

a fifth flip-flop configured to latch the second bit of the first gating signal to generate the first bit of the column address signal in response to a second bit of the column control signal; and a sixth flip-flop configured to latch the third bit of the first gating signal to generate the first bit of the column address signal in response to a third bit of the column control signal.

12. The semiconductor memory device of claim 4, wherein each of the bank slave circuits includes:

a first gating circuit configured to latch the second address signal to generate a first gating signal in response to the at least one write address control signal;

a bank coding circuit configured to perform bank coding on the first gating signal to generate a coding signal; and a second gating circuit configured to latch the coding signal to generate a first bit of the bank address signal in response to the column control signal.

13. The semiconductor memory device of claim 12, wherein the first gating circuit comprises:

a first flip-flop configured to latch a first bit of the second address signal to generate a first bit of the first gating signal in response to a first bit of the at least one write address control signal;

a second flip-flop configured to latch the first bit of the second address signal to generate a second bit of the first gating signal in response to a second bit of the at least one write address control signal; and a third flip-flop configured to latch the first bit of the second address signal to generate a third bit of the first gating signal in response to a third bit of the at least one write address control signal.

14. The semiconductor memory device of claim 13, wherein the bank coding circuit includes:

a first bank coder configured to perform the bank coding on the first bit of the first gating signal to generate a first bit of the coding signal;

a second bank coder configured to perform the bank coding on the second bit of the first gating signal to generate a second bit of the coding signal; and a third bank coder configured to perform the bank coding on the third bit of the first gating signal to generate a third bit of the coding signal.

15. The semiconductor memory device of claim 14, wherein the second gating circuit includes:

a fourth flip-flop configured to latch the first bit of the coding signal to generate the first bit of the bank address signal in response to a first bit of the column control signal;

a fifth flip-flop configured to latch the second bit of the coding signal to generate the first bit of the bank address signal in response to a second bit of the column control signal; and a sixth flip-flop configured to latch the third bit of the coding signal to generate the first bit of the bank address signal in response to a third bit of the column control signal.

16. The semiconductor memory device of claim 2, wherein the input latency control circuit has a write latency of seven and a burst length of four.

17. The semiconductor memory device of claim 16, wherein the burst length counter includes:

a first flip-flop configured to latch the first signal in response to the internal clock signal; and a second flip-flop configured to latch an output signal of the first flip-flop to output the second signal in response to the internal clock signal.

18. The semiconductor memory device of claim 16, wherein the first delay circuit includes:

a first flip-flop configured to latch a signal of an input terminal to generate a first bit of the at least one write address control signal in response to the write command signal;

a second flip-flop configured to latch the first bit of the at least one write address control signal to generate a second bit of the at least one write address control signal in response to the write command signal;

a third flip-flop configured to latch the second bit of the at least one write address control signal to generate a third bit of the at least one write address control signal in response to the write command signal;

a fourth flip-flop configured to latch the third bit of the at least one write address control signal to generate a fourth bit of the at least one write address control signal in response to the write command signal; and a fifth flip-flop configured to latch the fourth bit of the at least one write address control signal to generate a fifth bit of the at least one write address control signal in response to the write command signal, an output terminal of the fifth flip-flop being electrically coupled to the input terminal of the first flip-flop.

19. The semiconductor memory device of claim 16, wherein the second delay circuit includes:

a first flip-flop configured to latch a signal of an input terminal to generate a first bit of the column control signal in response to the second signal;

a second flip-flop configured to latch the first bit of the column control signal to generate a second bit of the column control signal in response to the second signal;

a third flip-flop configured to latch the second bit of the column control signal to generate a third bit of the column control signal in response to the second signal;

a fourth flip-flop configured to latch the third bit of the column control signal to generate a fourth bit of the column control signal in response to the second signal; and a fifth flip-flop configured to latch the fourth bit of the column control signal to generate a fifth bit of the column control signal in response to the second signal, an output terminal of the fifth flip-flop being electrically coupled to the input terminal of the first flip-flop.

20. The semiconductor memory device of claim 16, wherein each of the column slave circuits includes:
   a first gating circuit configured to latch the first address signal to generate a first gating signal in response to the at least one write address control signal; and
   a second gating circuit configured to latch the first gating signal to generate a first bit of the column address signal in response to the column control signal.

21. The semiconductor memory device of claim 20, wherein the first gating circuit includes:
   a first flip-flop configured to latch a first bit of the first address signal to generate a first bit of the first gating signal in response to a first bit of the at least one write address control signal;
   a second flip-flop configured to latch the first bit of the first address signal to generate a second bit of the first gating signal in response to a second bit of the at least one write address control signal;
   a third flip-flop configured to latch the first bit of the first address signal to generate a third bit of the first gating signal in response to a third bit of the at least one write address control signal;
   a fourth flip-flop configured to latch the first bit of the first address signal to generate a fourth bit of the first gating signal in response to a fourth bit of the at least one write address control signal; and
   a fifth flip-flop configured to latch the first bit of the first address signal to generate a fifth bit of the first gating signal in response to a fifth bit of the at least one write address control signal.

22. The semiconductor memory device of claim 21, wherein the second gating circuit includes:
   a sixth flip-flop configured to latch the first bit of the first gating signal to generate the first bit of the column address signal in response to a first bit of the column control signal;
   a seventh flip-flop configured to latch the second bit of the first gating signal to generate the first bit of the column address signal in response to a second bit of the column control signal;
   an eighth flip-flop configured to latch the third bit of the first gating signal to generate the first bit of the column address signal in response to a third bit of the column control signal;
   a ninth flip-flop configured to latch the fourth bit of the first gating signal to generate the first bit of the column address signal in response to a fourth bit of the column control signal; and
   a tenth flip-flop configured to latch the fifth bit of the first gating signal to generate the first bit of the column address signal in response to a fifth bit of the column control signal.

23. The semiconductor memory device of claim 16, wherein each of the bank slave circuits includes:
   a first gating circuit configured to latch the second address signal to generate a first gating signal in response to the at least one write address control signal;
   a bank coding circuit configured to perform bank coding on the first gating signal to generate a coding signal; and
   a second gating circuit configured to latch the coding signal to generate a first bit of the bank address signal in response to the column control signal.

24. The semiconductor memory device of claim 23, wherein the first gating circuit includes:
   a first flip-flop configured to latch a first bit of the second address signal to generate a first bit of the first gating signal in response to a first bit of the at least one write address control signal;
   a second flip-flop configured to latch the first bit of the second address signal to generate a second bit of the first gating signal in response to a second bit of the at least one write address control signal;
   a third flip-flop configured to latch the first bit of the second address signal to generate a third bit of the first gating signal in response to a third bit of the at least one write address control signal;
   a fourth flip-flop configured to latch the first bit of the second address signal to generate a fourth bit of the first gating signal in response to a fourth bit of the at least one write address control signal; and
   a fifth flip-flop configured to latch the first bit of the second address signal to generate a fifth bit of the first gating signal in response to a fifth bit of the at least one write address control signal.

25. The semiconductor memory device of claim 24, wherein the bank coding circuit includes:
   a first bank coder configured to perform the bank coding on the first bit of the first gating signal to generate a first bit of the coding signal;
   a second bank coder configured to perform the bank coding on the second bit of the first gating signal to generate a second bit of the coding signal;
   a third bank coder configured to perform the bank coding on the third bit of the first gating signal to generate a third bit of the coding signal;
   a fourth bank coder configured to perform the bank coding on the fourth bit of the first gating signal to generate a fourth bit of the coding signal; and
   a fifth bank coder configured to perform the bank coding on the fifth bit of the first gating signal to generate a fifth bit of the coding signal.

26. The semiconductor memory device of claim 25, wherein the second gating circuit includes:
   a sixth flip-flop configured to latch the first bit of the coding signal to generate the first bit of the bank address signal in response to a first bit of the column control signal;
   a seventh flip-flop configured to latch the second bit of the coding signal to generate the first bit of the bank address signal in response to a second bit of the column control signal;
   an eighth flip-flop configured to latch the second bit of the coding signal to generate the first bit of the bank address signal in response to a third bit of the column control signal; and
   an ninth flip-flop configured to latch the second bit of the coding signal to generate the first bit of the bank address signal in response to a fourth bit of the column control signal.

27. A semiconductor memory device, comprising:
   a clock buffer configured to generate an internal clock signal based on an external clock signal;
   a command decoder configured to decode an external command signal to generate a write command signal; and
   an input latency control circuit configured to generate a column control signal and at least one write address control signal based on the internal clock signal, the write command signal and a write latency signal and configured to gate an address signal in a pipeline mode to generate a column address signal and a bank address signal based on the column control signal and the at least one write address control signal, wherein the input latency control circuit includes:
- a master circuit configured to generate the column control signal, a first write address control signal, and a second write address control signal based on the internal clock signal, the write command signal and the write latency signal;
- at least one column slave circuit configured to gate a first address signal in the pipeline mode to generate the column address signal in response to the column control signal, the first write address control signal, and the second write address control signal; and
- at least one bank slave circuit configured to gate a second address signal in the pipeline mode to generate the bank address signal in response to the column control signal, the first write address control signal, and the second write address control signal.

28. The semiconductor memory device of claim 27, wherein the master circuit includes:
- a write latency counter configured to delay the write command signal to generate a first signal in response to the internal clock signal and the write latency signal;
- a burst length counter configured to delay the first signal by a burst length to generate the column control signal, and configured to delay the first signal by a first time that corresponds to a half of the burst length to generate a second signal in response to the internal clock signal;
- a first delay circuit configured to generate the first write address control signal having a plurality of bits in response to the first signal, neighboring bits of the first write address control signal having a phase difference corresponding to a period of the first signal; and
- a second delay circuit configured to generate the second write address control signal having a plurality of bits in response to the second signal, neighboring bits of the second write address control signal having a phase difference corresponding to a period of the second signal.

29. The semiconductor memory device of claim 28, wherein the write latency counter sets a delay time of the write command signal based on an enable bit of the write latency signal.

30. The semiconductor memory device of claim 28, wherein the burst length counter includes:
- a first flip-flop configured to latch the first signal to generate the second signal in response to the internal clock signal; and
- a second flip-flop configured to latch the second signal to generate the column control signal in response to the internal clock signal.

31. The semiconductor memory device of claim 28, wherein the first delay circuit includes:
- a first flip-flop configured to latch a signal of an input terminal to generate a first bit of the first write address control signal in response to the first signal;
- a second flip-flop configured to latch the first bit of the first write address control signal to generate a second bit of the first write address control signal in response to the first signal;
- a third flip-flop configured to latch the second bit of the first write address control signal to generate a third bit of the first write address control signal in response to the first signal;
- a fourth flip-flop configured to latch the third bit of the first write address control signal to generate a fourth bit of the first write address control signal in response to the first signal; and
- a fifth flip-flop configured to latch the fourth bit of the first write address control signal to generate a fifth bit of the first write address control signal in response to the first signal, an output terminal of the fifth flip-flop being electrically coupled to the input terminal of the first flip-flop.

32. The semiconductor memory device of claim 28, wherein the second delay circuit includes:
- a first flip-flop configured to latch a signal of an input terminal to generate a first bit of the second write address control signal in response to the second signal;
- a second flip-flop configured to latch the first bit of the second write address control signal to generate a second bit of the second write address control signal in response to the second signal;
- a third flip-flop configured to latch the second bit of the second write address control signal to generate a third bit of the second write address control signal in response to the second signal;
- a fourth flip-flop configured to latch the third bit of the second write address control signal to generate a fourth bit of the second write address control signal in response to the second signal; and
- a fifth flip-flop configured to latch the fourth bit of the second write address control signal to generate a fifth bit of the second write address control signal in response to the second signal, an output terminal of the fifth flip-flop being electrically coupled to the input terminal of the first flip-flop.

33. The semiconductor memory device of claim 28, wherein each of the column slave circuits includes:
- an input stage configured to latch the first address signal to generate a latched address signal in response to the write command signal;
- a first gating circuit configured to latch the latched address signal to generate a first gating signal in response to the first write address control signal;
- a second gating circuit configured to latch the first gating signal to generate a second gating signal in response to the second write address control signal; and
- an output stage configured to latch the second gating signal to generate a first bit of the column address signal in response to the column control signal.

34. The semiconductor memory device of claim 33, wherein each of the input stage and the output stage includes a flip-flop.

35. The semiconductor memory device of claim 33, wherein the first gating circuit includes:
- a first flip-flop configured to latch a latched address signal to generate a first bit of the first gating signal in response to a first bit of the first write address control signal;
- a second flip-flop configured to latch the latched address signal to generate a second bit of the first gating signal in response to a second bit of the first write address control signal;
- a third flip-flop configured to latch the latched address signal to generate a third bit of the first gating signal in response to a third bit of the first write address control signal;
- a fourth flip-flop configured to latch the latched address signal to generate a fourth bit of the first gating signal in response to a fourth bit of the first write address control signal; and a fifth flip-flop configured to latch the latched address signal to generate a fifth bit of the first gating signal in response to a fifth bit of the first write address control signal.

36. The semiconductor memory device of claim 35, wherein the second gating circuit includes:
a sixth flip-flop configured to latch the first bit of the first gating signal to generate the second gating signal in response to a first bit of the second write address control signal;
a seventh flip-flop configured to latch the second bit of the first gating signal to generate the second gating signal in response to a second bit of the second write address control signal;
an eighth flip-flop configured to latch the third bit of the first gating signal to generate the second gating signal in response to a third bit of the second write address control signal;
a ninth flip-flop configured to latch the fourth bit of the first gating signal to generate the second gating signal in response to a fourth bit of the second write address control signal; and
a tenth flip-flop configured to latch the fifth bit of the first gating signal to generate the second gating signal in response to a fifth bit of the second write address control signal.

37. The semiconductor memory device of claim 33, wherein the first gating circuit includes:
a first flip-flop configured to latch a first bit of the latched address signal to generate a first bit of the first gating signal in response to a first bit of the first write address control signal;
a second flip-flop configured to latch the first bit of the latched address signal to generate a second bit of the first gating signal in response to a second bit of the first write address control signal;
a third flip-flop configured to latch the first bit of the latched address signal to generate a third bit of the first gating signal in response to a third bit of the first write address control signal;
a fourth flip-flop configured to latch the first bit of the latched address signal to generate a fourth bit of the first gating signal in response to a fourth bit of the first write address control signal; and
a fifth flip-flop configured to latch the first bit of the latched address signal to generate a fifth bit of the first gating signal in response to a fifth bit of the first write address control signal.

38. The semiconductor memory device of claim 37, wherein the bank coding circuit includes:
a first bank coder configured to perform the bank coding on the first bit of the first gating signal to generate a first bit of the coding signal;
a second bank coder configured to perform the bank coding on the second bit of the first gating signal to generate a second bit of the coding signal;
a third bank coder configured to perform the bank coding on the third bit of the first gating signal to generate a third bit of the coding signal;
a fourth bank coder configured to perform the bank coding on the fourth bit of the first gating signal to generate a fourth bit of the coding signal; and
a fifth bank coder configured to perform the bank coding on the fifth bit of the first gating signal to generate a fifth bit of the coding signal.

39. The semiconductor memory device of claim 37, wherein the second gating circuit includes:

a sixth flip-flop configured to latch the first bit of the coding signal to generate the second gating signal in response to a first bit of the second write address control signal;
a seventh flip-flop configured to latch the second bit of the coding signal to generate the second gating signal in response to a second bit of the second write address control signal;
an eighth flip-flop configured to latch the third bit of the coding signal to generate the second gating signal in response to a third bit of the second write address control signal;
an ninth flip-flop configured to latch the fourth bit of the coding signal to generate the second gating signal in response to a fourth bit of the second write address control signal; and
a tenth flip-flop configured to latch the fifth bit of the coding signal to generate the second gating signal in response to a fifth bit of the second write address control signal.

40. The semiconductor memory device of claim 28, wherein each of the bank slave circuits includes:
an input stage configured to latch the second address signal to generate a latched address signal in response to the write command signal;
a first gating circuit configured to latch the latched address signal to generate a first gating signal in response to the first write address control signal;
a bank coding circuit configured to perform bank coding on the first gating signal to generate a coding signal;
a second gating circuit configured to latch the coding signal to generate a second gating signal in response to the second write address control signal; and
an output stage configured to latch the second gating signal to generate a first bit of the bank address signal in response to the column control signal.

41. The semiconductor memory device of claim 40, wherein each of the input stage and the output stage includes a flip-flop.

42. An input latency control circuit, comprising:
a master circuit configured to generate a column control signal and a first write address control signal based on an internal clock signal, a write command signal and a write latency signal;
at least one column slave circuit configured to gate a first address signal in a pipeline mode to generate a column address signal in response to the column control signal and one of the first write address control signal and a second write address control signal; and
at least one bank slave circuit configured to gate a second address signal in the pipeline mode to generate the bank address signal in response to the column control signal and at least one of the first and second write address control signals.

43. The input latency control circuit of claim 42, wherein the master circuit is further configured to generate the second write address control signal.

44. The input latency control circuit of claim 43, wherein if the master circuit is not configured to generate the second write address control signal, the at least one column slave circuit operates in response to the column control signal and the second write address control signal.

45. The input latency control circuit of claim 43, wherein if the master circuit is not configured to generate the second write address control signal, the at least one bank slave circuit operates in response to the column control signal, the first write address control signal and the second write address control signal.

46. The input latency control circuit of claim 42, wherein if the master circuit is not configured to generate the second write address control signal, the at least one column slave circuit operates in response to the column control signal and the first write address control signal.

47. The input latency control circuit of claim 42, wherein if the master circuit is not configured to generate the second write address control signal, the at least one bank slave circuit operates in response to the column control signal and the first write address control signal.

* * * * *